US010079062B2

(12) United States Patent
Kashihara

(10) Patent No.: US 10,079,062 B2
(45) Date of Patent: Sep. 18, 2018

(54) SEMICONDUCTOR DEVICE

(71) Applicant: Renesas Electronics Corporation, Tokyo (JP)

(72) Inventor: Yoji Kashihara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/326,329

(22) PCT Filed: Aug. 14, 2014

(86) PCT No.: PCT/JP2014/071429
§ 371 (c)(1),
(2) Date: Jan. 13, 2017

(87) PCT Pub. No.: WO2016/024355
PCT Pub. Date: Feb. 18, 2016

(65) Prior Publication Data
US 2017/0206971 A1     Jul. 20, 2017

(51) Int. Cl.
*G11C 16/04*     (2006.01)
*G11C 16/24*     (2006.01)
(Continued)

(52) U.S. Cl.
CPC .......... *G11C 16/24* (2013.01); *G11C 16/0425* (2013.01); *G11C 16/0433* (2013.01);
(Continued)

(58) Field of Classification Search
CPC .. G11C 16/0425; G11C 16/08; G11C 16/0433
(Continued)

(56) References Cited

U.S. PATENT DOCUMENTS

| 5,132,928 A | 7/1992 | Hayashikoshi et al. |
| 6,031,764 A | 2/2000 | Imamiya et al. |

(Continued)

FOREIGN PATENT DOCUMENTS

| JP | H 03-5995 A | 1/1991 |
| JP | H 11-177071 A | 7/1999 |

(Continued)

OTHER PUBLICATIONS

Japanese Office Action dated Sep. 19, 2017 in Japanese Application No. 2016-542486 with an English translation thereof.
(Continued)

*Primary Examiner* — Amir Zarabian
*Assistant Examiner* — Jay Radke
(74) *Attorney, Agent, or Firm* — McGinn I.P. Law Group, PLLC.

(57) ABSTRACT

A semiconductor device includes a first memory mat (1L) including a plurality of split type memory cells (250L), a second memory mat (1R) including a plurality of split type memory cells (250R), a first control gate line (CGL) connected to a control gate (CG) of a split type memory cell (100L), and a second control gate line (CGR) connected to a control gate (CG) of a split type memory cell (100R). The semiconductor device further includes a first memory gate line (MGL) connected to a memory gate (MG) of the split type memory cell (100L), and a second memory gate line (MGR) connected to a memory gate (MG) of the split type memory cell (100R).

18 Claims, 21 Drawing Sheets

(51) Int. Cl.
    *G11C 16/14*     (2006.01)
    *G11C 16/34*     (2006.01)
    *G11C 16/08*     (2006.01)

(52) U.S. Cl.
    CPC .............. *G11C 16/08* (2013.01); *G11C 16/14* (2013.01); *G11C 16/3427* (2013.01)

(58) Field of Classification Search
    USPC ........................................ 365/185.23, 185.05
    See application file for complete search history.

(56) References Cited

U.S. PATENT DOCUMENTS

| | | | |
|---|---|---|---|
| 6,134,144 A * | 10/2000 | Lin ........................ | G11C 16/30 257/E27.103 |
| 8,174,901 B2 | 5/2012 | Matsubara et al. | |
| 2004/0190343 A1* | 9/2004 | Park ........................ | G11C 7/18 365/185.28 |
| 2005/0001261 A1* | 1/2005 | Natori ................. | G11C 16/0466 257/316 |
| 2005/0270851 A1* | 12/2005 | Kato .................. | G11C 16/0425 365/185.29 |
| 2006/0281262 A1* | 12/2006 | Hisamoto ......... | H01L 21/28282 438/264 |
| 2009/0196102 A1* | 8/2009 | Kim .................... | G11C 7/1045 365/185.11 |
| 2010/0232232 A1 | 9/2010 | Matsubara et al. | |
| 2013/0228846 A1* | 9/2013 | La Rosa ............. | H01L 29/7889 257/321 |
| 2014/0112055 A1* | 4/2014 | Kawahara ............. | G11C 13/00 365/148 |
| 2016/0336074 A1 | 11/2016 | Tanaka et al. | |

FOREIGN PATENT DOCUMENTS

| | | |
|---|---|---|
| JP | 2003-526192 A | 9/2003 |
| JP | 2009-246370 A | 10/2009 |
| JP | 2010-211889 A | 9/2010 |

OTHER PUBLICATIONS

International Search Report (ISR) (PCT Form PCT/ISA/210), in PCT/JP2014/071429, dated Oct. 28, 2014.
Extended European Search Report dated Feb. 13, 2018.
Taiwanese Office Action dated Jun. 4, 2018 with an English translation thereof.

* cited by examiner

| VP | VN | VIN | VOUT |
|---|---|---|---|
| VPPs | VPPu | VPPu | VPPs |
| VPPs | VPPu | VPPs | VPPu |
| VPPu | VSS | VPPu | VSS |
| VPPu | VSS | VPPs | VSS |
| VR1 | VSS | VSS | VR1 |
| VR1 | VSS | VR1 | VSS |
| VSS | VSS | VSS | VSS |
| VSS | VSS | VR1 | VSS |

SEMICONDUCTOR DEVICE

TECHNICAL FIELD

The present invention relates to semiconductor devices, for example, a semiconductor device including a split gate type nonvolatile memory.

BACKGROUND ART

There are conventionally known techniques for improving the arrangement of drivers that drive word lines, control gate lines, or memory gate lines connected to memory cells, or for reducing the number of drivers.

A semiconductor device of Japanese Patent Laying-Open No. 2009-246370 (PTD 1), for example, includes a first driver that drives a control gate line and a second driver that drives a memory gate line. The first driver uses a first voltage as an operating power supply, and the second driver uses a voltage higher than the first voltage as an operating power supply. As such, the first driver is disposed on one side and the second driver is disposed on the other side, with a nonvolatile memory cell array interposed therebetween. It is possible to separate drivers each operated with a high voltage as an operating power supply and circuits each operated with a relatively low voltage as an operating power supply from one another.

A memory cell array of Japanese Patent Laying-Open No. 11-177071 (PTD 2) is divided into a plurality of blocks in the bit line direction, and furthermore, each block is divided into a plurality of sub-blocks in the word line direction. The word lines driven by a word line driving circuit are connected by control transistors formed in boundary regions between the sub-blocks, and are continuously provided to extend over the plurality of sub-blocks. Consequently, simultaneous erasure on a sub-block basis can be performed.

CITATION LIST

Patent Documents

PTD 1: Japanese Patent Laying-Open No. 2009-246370
PTD 2: Japanese Patent Laying-Open No. 11-177071

SUMMARY OF INVENTION

Technical Problem

In the device described in Japanese Patent Laying-Open No. 2009-246370 (PTD 1), however, although a current needs to be passed through a memory cell of the nonvolatile memory array when writing data into the memory cell, the number of memory cells into which the data can be written at a time is limited due to current consumption constraints. Thus, writing is performed multiple times into the memory cells on a selected memory gate line. In this case, memory cells other than those subjected to writing on the selected memory gate line are put under stress referred to as a disturb. As a result, erroneous writing or erroneous erasure occurs in the memory cells other than those subjected to writing.

The device described in Japanese Patent Laying-Open No. 11-177071 (PTD 2), which is intended for NAND memory cells, is configured to avoid a disturb by bringing the word lines into a floating state. However, in the split gate type memory cells such as described in Japanese Patent Laying-Open No. 2009-246370 (PTD 1), the control gate lines or memory gate lines cannot be brought into a floating state.

Moreover, in Japanese Patent Laying-Open No. 2009-246370 (PTD 1), the data cannot be read at high speed from the memory cell of the nonvolatile memory array if the control gate line is long.

The other problems and new features will become apparent from the description of the present specification and the accompanying drawings.

Solution to Problem

A semiconductor device of one embodiment of the present invention includes a control gate line divided into a plurality of sections and a memory gate line divided into a plurality of sections.

Advantageous Effects of Invention

According to one embodiment of the present invention, high-speed reading can be performed, and a disturb during writing can be suppressed.

DESCRIPTION OF EMBODIMENTS

Embodiments of the present invention will be described below with reference to the drawings. Unless otherwise specified, a transistor refers to an enhanced MOS (Metal-Oxide-Semiconductor) transistor in the following description.

[First Embodiment]

Figure 1:
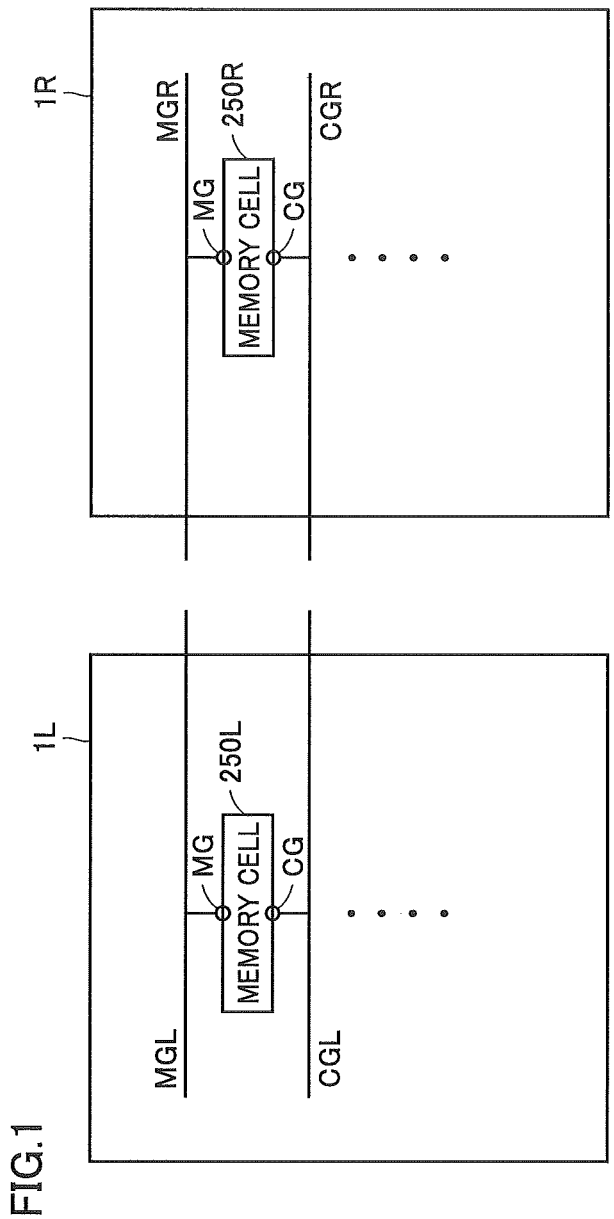
FIG. 1 illustrates a configuration of a semiconductor device of a first embodiment.

FIG. 1 illustrates a configuration of a semiconductor device of a first embodiment.

As shown in FIG. 1, this semiconductor device includes a first memory mat 1L, having a plurality of split gate type memory cells 250L, and a second memory mat 1R having a plurality of split gate type memory cells 250R.

This semiconductor device fluffier includes a first control gate line CGL connected to a control gate CG of each split gate type memory cell 100L of a row of first memory mat 1L, and a second control gate line CGR connected to a control gate CG of each split gate type memory cell 100R of the row of second memory mat 1R.

This semiconductor device further includes a first memory gate line MGL connected to a memory gate MG of each split gat type memory cell 100L of the row of first memory mat 1L, and a second memory gate line MGR connected to a memory gate MG of each split gate type memory cell 100R of the row of second memory mat 1R.

According to the present embodiment, the control gate line is divided into two sections, thereby allowing a reduction in load and a fast rise. As a result, high-speed reading can be performed.

Further, the memory gate line is divided into two sections, thereby suppressing a disturb during writing.

[Second Embodiment]

Figure 2:
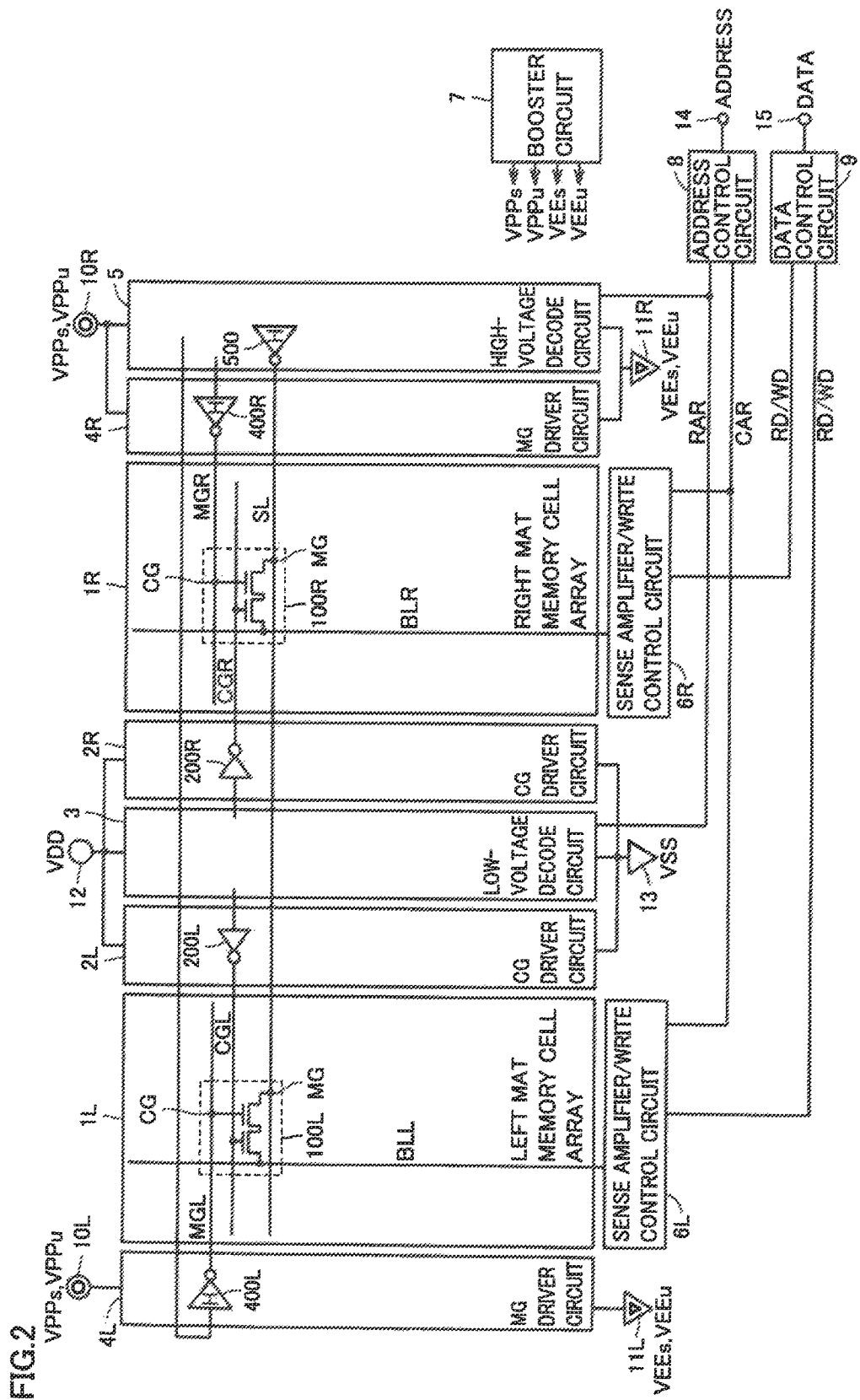
FIG. 2 illustrates a configuration of a semiconductor device of a second embodiment.

FIG. 2 illustrates a configuration of a semiconductor device of a second embodiment.

Referring to FIG. 2, a memory cell array of this semiconductor device is divided into two sections at the center. This semiconductor device includes a left mat memory cell array 1L, a right mat memory cell array 1R, a CG driver circuit 2L for left mat memory cell array 1L, a CG driver circuit 2R for right mat memory cell array 1R, a high-voltage decode circuit 5, and a sense amplifier/write control circuit 6L for left mat memory cell array 1L. This semiconductor device further includes a sense amplifier/write control circuit 6R for right mat memory cell array 1R, an MG driver circuit 4L for left mat memory cell array 1L, an MG driver circuit 4R for right mat memory cell array 1R, a low-voltage decode circuit 3, an address control circuit 8, a data control circuit 9, and a booster circuit 7.

Left mat memory cell array 1L has a plurality of memory cells 100L arranged in a matrix. Right mat memory cell array 1R has a plurality of memory cells 100R arranged in a matrix. Memory cells 100L and 100R are split gate type nonvolatile memories. In the following description, left mat memory cell array 1L may be abbreviated as left memory mat 1L or left mat 1L, and right mat memory cell array 1R may be abbreviated as right memory mat 1R or right mat 1R.

Memory cells 100L and 100R each have a control gate CG and a memory gate MG disposed over a channel formation region between source and drain regions with a gate insulating film interposed therebetween. Disposed between memory gate MG and the gate insulating film is a charge trapping region (SiN) such as silicon nitride. A source or drain region on the select gate side is connected to a bit line, and a source or drain region on the memory gate side is connected to a source line SL.

Memory cell 100L connects a bit line BLL to source line SL. Control gate CG of memory cell 100L is connected to a control gate line CGL for left mat memory cell array 1L, and memory gate MG of memory cell 100L is connected to a memory gate line MGL for left mat memory cell array 1L. Memory cell 100R connects a bit line BLR and source line SL. Control gate CG of memory cell 100R is connected to a control gate line CGR for right mat memory cell array 1R, and memory gate MG of memory cell 100R is connected to a memory gate line MGR of right mat memory cell array 1R.

Sense amplifier/write control circuit 6L is connected to memory cell 100L, in left mat memory cell array 1L through bit line BLL, to control reading and writing of data from and to memory cell 100L. Sense amplifier/write control circuit 6R is connected to memory cell 100R in right mat memory cell array 1R through bit line BLR, to control reading and writing of data from and to memory cell 100R.

As used herein, the reading and writing of data mean reading and writing of normal data.

Address control circuit 8 captures an address from an external address input terminal 14, and transmits a row address signal RAR to high-voltage decode circuit 3 and low-voltage decode circuit 5, and also transmits a column address signal CAR to sense amplifier/write control circuits 6L and 6R.

Data control circuit 9 outputs read data RD, which is output from sense amplifier/write control circuits 6L and 6R, to an external data input/output terminal 15, and outputs write data WD, which is input to external data input/output terminal 15, to sense amplifier/write control circuits 6L and 6R.

CG driver circuit 2L includes a plurality of CG drivers 200L that drive word lines (control gate lines) (CGL) in 1L used mainly for reading from 1L. CG driver circuit 2R includes a plurality of CG drivers 200R that drive word lines (CGR) in 1R used mainly for reading from 1R. Low-voltage decode circuit 3 selects a row based on row address signal RAR supplied from address control circuit 8, and selects CG drivers 200L and 200R corresponding to the selected row.

CG driver circuits 2L and 2R are disposed between left mat memory cell array 1L and right mat memory cell array 1R. Specifically, CG driver circuit 2L is disposed adjacent to and on the right side of left mat memory cell array 1L. CG driver circuit 2R is disposed adjacent to and on the left side of right mat memory cell array 1R.

MG driver circuit 4L includes a plurality of MG drivers 400L that drive word lines (memory gate lines) (MGL) used mainly for writing. MG driver circuit 4R includes a plurality of MG drivers 400R that drive word lines (memory gate lines) (MGR) used mainly for writing.

MG driver circuit 4L is disposed outside a region surrounding both left mat memory cell array 1L and right mat memory cell array 1R, at a position adjacent to left mat memory cell array 1L. Specifically, MG driver circuit 4L is disposed adjacent to and on the left side of left mat memory cell array 1L.

MG driver circuit 4R is disposed outside the region surrounding both left mat memory cell array 1L and right mat memory cell array 1R, at a position adjacent to right mat memory cell array 1R. Specifically, MG driver circuit 4R is disposed adjacent to and on the right side of right mat memory cell array 1R.

High-voltage decode circuit 5 selects a row based on row address signal RAR supplied from address control circuit 8, and selects MG drivers 400L and 400R corresponding to the selected row. High-voltage decode circuit 5 further includes an SL driver 500 that drives source line SL connected to memory cells 100L and 100R.

Booster circuit 7 generates a rewrite pull-up voltage VPP and a rewrite pull-down voltage VEE, and supplies the voltages to positive power supply terminals 10L, 10R and negative power supply terminals 11L, 11R of MG driver circuits 4L, 4R and of high-voltage decode circuit 5. Here, rewrite pull-up voltage VPP consists of a pull-up voltage VPPs for selected block and a pull-up voltage VPPu for non-selected block. Rewrite pull-down voltage VEE consists of a pull-down voltage VEEs for selected block and a pull-down voltage VEEu for non-selected block. During application of a write pulse, a relation of VPPs >VPPu=VEEs>VEEu=VSS is satisfied.

A positive power supply VDD and a negative pull-down power supply VSS of a low-voltage system are connected to CG driver circuits 2L and 2R, and to a pull-up voltage terminal 12 and a pull-down voltage terminal 13 of low-voltage decode circuit 3, respectively.

If importance is to be placed on high-speed performance, it is possible to employ a configuration in which each of bit lines BLL and BLR is separated for reading and writing, or to employ a configuration in which each of bit lines BLL and BLR is hierarchically separated into a main bit line and a sub bit line. In addition, although source line SL is provided for each row in FIG. 2, it is possible to employ a configuration in which a single source line SL is shared among a plurality of rows of a unit of rewrite, or to employ a configuration in which source line SL is divided into a plurality of sections within a single row so as to reduce a disturb.

In consideration of higher-speed reading, the control gate line serving as a word line for reading is divided into two sections for left memory mat 1L and for right memory mat 1R at the center of the memory array in order to reduce a load, and control gate lines CGL and CGR thus divided are driven by independent CG drivers 200L and 200R, respectively. Further, in order to minimize a read path, low-voltage decode circuit 3 that controls CG drivers 200L and 200R is disposed at a central portion of the memory cell array. That is, low-voltage decode circuit 3 is disposed between left memory mat 1L and right memory mat 1R.

Meanwhile, in order to prevent a disturb during writing such as described above, the memory gate line serving as a word line for writing also divided at the center in a manner similar to the control gate line. Memory gate lines MGL and MGR thus divided are driven by MG driver circuits 4L and 4R at opposite ends of the memory array, respectively.

Figure 3:
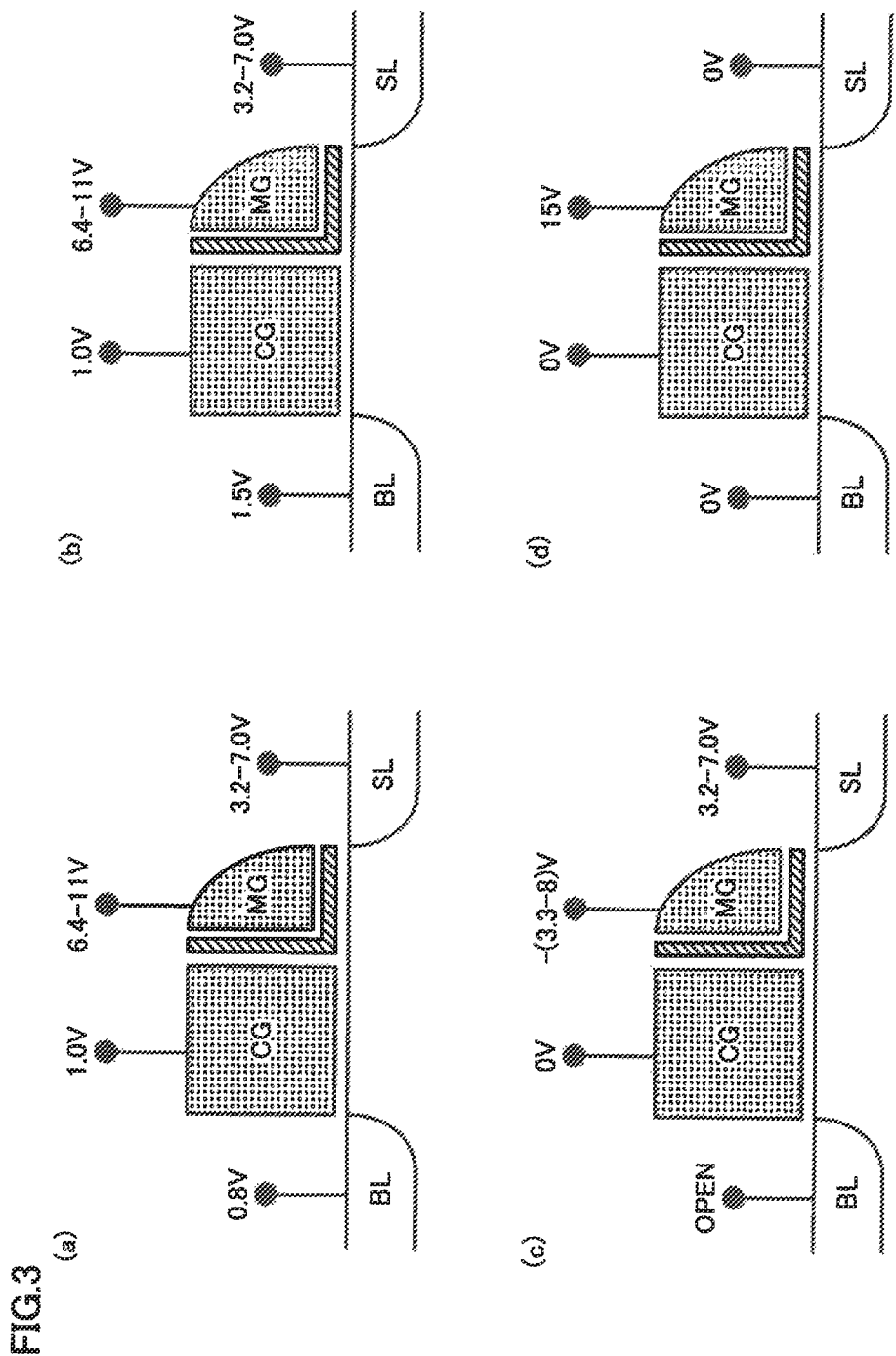
FIG. 3(a) illustrates voltages applied to a selected memory cell during writing.
FIG. 3(b) illustrates voltages applied to a non-selected memory cell during writing.
FIG. 3(c) illustrates voltages applied to a memory cell during erasure with the BTBT (Band-To-Band Tunneling) method.
FIG. 3(d) illustrates voltages applied to a memory cell during erasure with the FN (Fowler Nordheim) method.

FIG. 3(a) illustrates voltages applied to a selected memory cell during writing.

In the selected memory cell, a voltage of 1.0 V is applied to control gate CG, a voltage of 6.4 to 11 V is applied to memory gate MG, a voltage of 0.8 V is applied to bit line BL, and a voltage of 3.2 to 7.0 V is applied to source line SL.

By supplying the above voltages, a write current flows from source line SL to bit line BL, causing hot electrons generated at a boundary portion between control gate CG and memory gate MG to be injected into the charge trapping region (SiN).

FIG. 3(b) illustrates voltages applied to a non-selected memory cell during writing.

In the non-selected memory cell, a voltage of 1.0 V is applied to control gate CG, a voltage of 6.4 to 11 V is applied to memory gate MG, a voltage of 1.5 V is applied to bit line BL, and a voltage of 3.2 to 7.0 V is applied to source line SL.

Although the voltage of bit line BL connected to the non-selected memory cell is not 0.8 V as in the selected memory cell, the voltage applied to memory gate MG of the non-selected memory cell is 6.4 to 11 V, the same as the voltage in the selected memory cell. As a result, erroneous writing or erroneous erasure occurs in the non-selected memory cell.

FIG. 3(c) illustrates voltages applied to a memory cell during erasure with the BTBT (Band-To-Band Tunneling) method.

In the memory cell, a voltage of 0 V is applied to control gate CG, a voltage of −8V to −3.3V is applied to memory gate MG, bit line BL is brought into a floating state, and a voltage of 3.2 V to 7.0 V is applied to source line SL.

By supplying the above voltages, electrons are extracted from the charge trapping region (SiN) into a well region (WELL) due to a high electric field between the well region (WELL) and memory gate MG.

FIG. 3(d) illustrates voltages applied to a memory cell during erasure with the FN (Fowler Nordheim) method.

In the memory cell, a voltage of 0 V is applied to control gate CG, a voltage of 15 V is applied to memory gate MG, a voltage of 0 V is applied to bit line BL, and a voltage of 0 V is applied to source line SL.

By supplying the above voltages, holes are injected from memory gate MG into the charge trapping region (SiN) due to FN tunneling. Further, electrons accumulated in the charge trapping region (SiN) during writing are extracted into memory gate MG.

Figure 4:
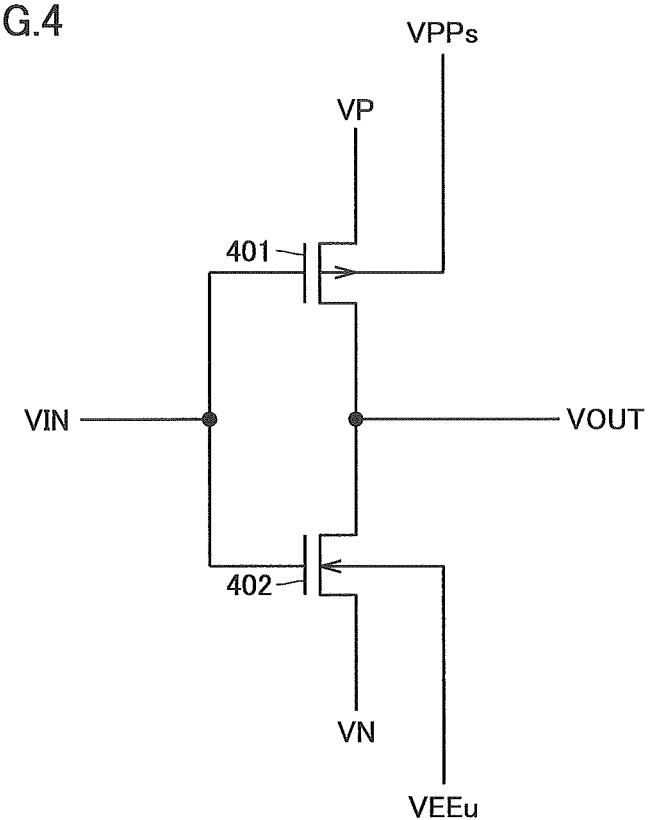
FIG. 4 shows a specific configuration of an MG driver.

FIG. 4 shows a specific configuration of each of MG drivers 400L and 400R.

Each of MG drivers 400L and 400R is formed of an inverter including a PMOS transistor 401 and an NMOS transistor 402.

PMOS transistor 401 is connected to a positive power supply VP, and NMOS transistor 402 is connected to a negative power supply VN. A substrate potential 10 of PMOS transistor 401 needs to be a maximum voltage within the semiconductor device, and a substrate potential 11 of NMOS transistor 402 needs to be a minimum potential within the semiconductor device. In a write state, the substrate potential of PMOS transistor 401 is VPPs, and substrate potential 11 of NMOS transistor 402 is VEEu (=VSS).

Each of MG drivers 400L and 400R receives an input voltage VIN, and outputs a voltage VOUT.

Figures 5, 6:
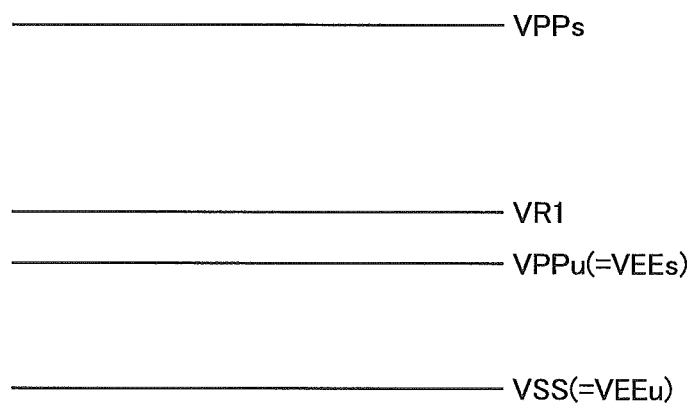
FIG. 5 illustrates a positive power supply, a negative power supply, and an output voltage relative to an input voltage applied to the MG driver of an embodiment of the present invention.
FIG. 6 illustrates relative magnitude of values of the output voltage of FIG. 5.

FIG. 5 illustrates positive power supply VP, negative power supply VN, and output voltage VOUT relative to input voltage VIN applied to the MG driver of the embodiment of the present invention. FIG. 6 illustrates relative magnitude of values of output voltage VOUT of FIG. 5.

Referring to FIGS. 5 and 6, when positive power supply VP is VPPs, negative power supply VN is VPPu, and input voltage VIN is VPPu, then output voltage VOUT of the MG driver is VPPs. When positive power supply VP is VPPs, negative power supply VN is VPPu, and input voltage VIN is VPPs, then output voltage VOUT of the MG driver is VPPu. When positive power supply VP is VPPu, negative power supply VN is VSS, and input voltage VIN is VPPu, then output voltage VOUT of the MG driver is VSS. When positive power supply VP is VPPu, negative power supply VN is VSS, and input voltage VIN is VPPs, then output voltage VOUT of the MG driver is VSS. When positive power supply VP is VR1, negative power supply VN is VSS, and input voltage VIN is VSS, then output voltage VOUT of the MG driver is VR1 When positive power supply VP is VR1, negative power supply VN is VSS, and input voltage VIN is VR1, then output voltage VOUT of the MG driver is VSS. When positive power supply VP is VSS, negative power supply VN is VSS, and input voltage VIN is VSS, then output voltage VOUT of the MG driver is VSS. When positive power supply VP is VSS, negative power supply VN is VSS, and input voltage VIN is VR1, then output voltage VOUT of the MG driver is VSS. The aforementioned VR1 is a voltage used during verify.

Figure 7:
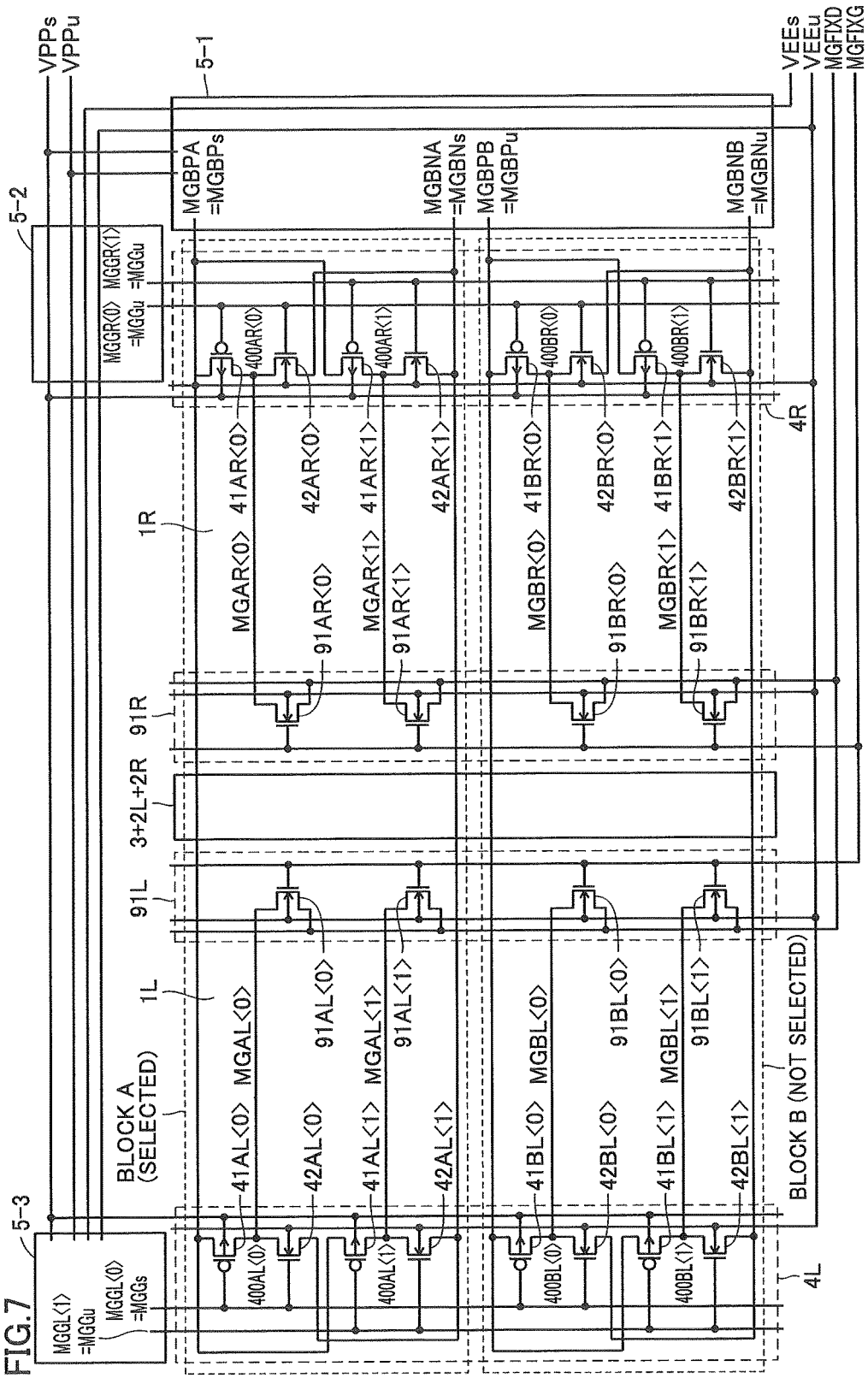
FIG. 7 shows a detailed configuration of the semiconductor device of the second embodiment.

FIG. 7 shows a detailed configuration of the semiconductor device of the second embodiment.

CG drivers 2L, 2R and low-voltage decode circuit 3 are disposed between left mat memory cell array 1L and right mat memory cell array 1R. It is noted that memory cells 100L, 100R, control gate lines CGL, CGR, source line SL, and bit lines BLL, BLR are omitted in FIG. 7.

High-voltage decode circuit 5 includes a first decoder 5-1, a second decoder 5-2 and a third decoder 5-3 (switch control circuit). First decoder 5-1, second decoder 5-2 and third decoder 5-3 are supplied with VPPs and VPPu as a positive power supply, and supplied with VEEs and VEEu as a negative power supply.

As shown in FIG. 7, this semiconductor device includes two blocks A and B. Either one of the blocks is selected during writing.

Block A includes memory cells of two rows (top two rows) of left mat memory cell array 1R and the right memory cell array, memory gate lines MGAL<0>, MGAL<1>, MGAR<0> and MGAR<1> connected to those memory cells, and the control gate lines (not shown). Block A also includes MG drivers 400AL<0>, 400AL<1>, 400AR<0> and 400AR<1> connected to the aforementioned memory gate lines included in block A, and the CG drivers (not shown) connected to the control gate lines included in block A. Block A also includes a positive-side voltage line MGBPA and a negative-side voltage line MGBNA connected to a positive power supply and a negative power supply of each of MG drivers 400AL<0>, 400AL<1>, 400AR<0> and 400AR<1> included in block A, respectively.

Block B includes memory cells of two rows (bottom two rows) of left mat memory cell array 1R and the right memory cell array, memory gate lines MGBL<0>, MGBL<1>, MGBR<0> and MGBR<1> connected to those memory cells, and the control gate lines (not shown). Block B also includes MG drivers 400BL<0>, 400BL<1>, 400BR<0> and 400BR<1> connected to the aforementioned memory gate lines included in block B, and the CG drivers (not shown) connected to the control gate lines included in block B. Block B also includes a positive-side voltage line MGBPB and a negative-side voltage line MGBNB connected to a positive power supply and a negative power supply of each of MG drivers 400BL<0>, 400BL<1>, 400BR<0> and 400BR<1> included in block B, respectively.

The positive-side voltage line and the negative-side voltage line of a selected block are supplied with select control voltages MGBPs and MGBNs. The positive-side voltage line and the negative-side voltage line of a non-selected block are supplied with non-select control voltages MGBPu and MGBNu. In the present embodiment, block A is the selected block, and therefore, positive-side voltage line MGBPA and negative-side voltage line MGBNA are supplied with select control voltages MGBPs and MGBNs, respectively, while positive-side voltage line MGBPB and negative-side voltage line MGBNB are supplied with non-select control voltages MGBPu and MGBNu, respectively.

During writing, one of the two blocks is selected, and one of the two memory mats is selected. Further, one of the two rows included in the selected block of the selected memory mat is selected.

In the present embodiment, it is assumed that block A is selected, left memory mat 1L is selected, and the upper low of block A and of left memory mat 1L is selected. A memory cell of the selected row is connected to memory gate line MGAL<0>, and memory gate line MGAL<0>is connected to MG driver 400AL<0>.

First decoder 5-1 supplies positive-side select control voltage MGBPs and negative-side select control voltage MGBNs to positive-side voltage line MGBPA and negative-side voltage line MGBNA included in selected block A, respectively. First decoder 5-1 supplies positive-side non-select control voltage MGBPu and negative-side non-select control voltage MGBNu to positive-side voltage line MGBPB and negative-side voltage line MGBNB included in non-selected block B, respectively.

First decoder 5-1 is disposed adjacent to MG driver circuit 4R.

Second decoder 5-2 supplies non-select control voltages MGGu and MGGu to a gate voltage line MGGR<0> and a gate voltage line MGGR<1> for controlling right mat memory array 1R, respectively.

Second decoder 5-2 is disposed adjacent to MG driver circuit 4R.

Third decoder 5-3 supplies select control voltage MGGs and non-select control voltage MGGu to a gate voltage line MGGL<0> and a gate voltage line MGGL<1> for controlling left mat memory array 1L, respectively.

Third decoder 5-3 is disposed adjacent to MG driver circuit 4L.

MG driver circuit 4L for left memory mat 1L includes MG drivers 400AL<0> and 400AL<1> included in block A, and includes MG drivers 400BL<0> and 400BL<1> included in block B. A voltage of gate voltage line MGGL<0> is supplied to MG drivers 400AL<0> and 400BL<0> of a row (0) in both blocks A and B of left memory mat 1L. A voltage of gate voltage line MGGL<1> is supplied to MG drivers 400AL<1> and 400BL<1> of a row (1) in both blocks A and B of left memory mat 1L.

MG driver 400AL<0> includes a PMOS transistor 41AL<0> and an NMOS transistor 42AL<0>. PMOS transistor 41AL<0> and NMOS transistor 42AL<0> each have a gate connected to gate voltage line MGGL<0>. PMOS transistor 41AL<0> has a source connected to positive-side voltage line MGBPA. NMOS transistor 42AL<0> has a source connected to negative-side voltage line MGBNA. PMOS transistor 41AL<0> and NMOS transistor 42AL<0> each have a drain connected together, and a node between them is connected to memory gate line MGAL<0>.

MG driver 400AL<1> is an inverter formed of a PMOS transistor 41AL<1> and an NMOS transistor 42AL<1>. PMOS transistor 41AL<1> and NMOS transistor 42AL<1> each have a gate connected to gate voltage line MGGL<1>. PMOS transistor 41AL<1> has a source connected to positive-side voltage line MGBPA. NMOS transistor 42AL<1> has a source connected to negative-side voltage line MGBNA. PMOS transistor 41AL<1> and NMOS transistor 42AL<1> each have a drain connected together, and a node between them is connected to memory gate line MGAL<1>.

MG driver 400BL<0> is an inverter formed of a PMOS transistor 41BL<0> and an NMOS transistor 42BL<0>. PMOS transistor 41BL<0> and NMOS transistor 42BL<0> each have a gate connected to gate voltage line MGGL<0>. PMOS transistor 41BL<0> has a source connected to positive-side voltage line MGBPB. NMOS transistor 42BL<0> has a source connected to negative-side voltage line MGBNB. PMOS transistor 41BL<0> and NMOS transistor 42BL<0> each have a drain connected together, and a node between them is connected to memory gate line MGBL<0>.

MG driver 400BL<1> is an inverter formed of a PMOS transistor 41BL<1> and an NMOS transistor 42BL<1>. PMOS transistor 41BL<1> and NMOS transistor 42BL<1> each have a gate connected to gate voltage line MGGL<1>. PMOS transistor 41BL<1> has a source connected to positive-side voltage line MGBPB. NMOS transistor 42BL<1> has a source connected to negative-side voltage line MGBNB. PMOS transistor 41BL<1> and NMOS transistor 42BL<1> each have a drain connected together, and a node between them is connected to memory gate line MGBL<1>.

MG driver circuit 4R for right memory mat 1R includes MG drivers 400AR<0> and 400AR<1> included in block A, and includes MG drivers 400BR<0> and 400BR<1> included in block B. A voltage of gate voltage line MGGR<0> is supplied to MG drivers 400AR<0> and 400BR<0> of the row (0) in both blocks A and B of right memory mat 1R. A voltage of gate voltage line MGGR<1> is supplied to MG drivers 400AR<1> and 400BR<1> of the row (1) in both blocks A and B of right memory mat 1R.

MG driver 400AR<0> is an inverter formed of a PMOS transistor 41AR<0> and an NMOS transistor 42AR<0>. PMOS transistor 41AR<0> and NMOS transistor 42AR<0> each have a gate connected to gate voltage line MGGR<0>. PMOS transistor 41AR<0> has a source connected to positive-side voltage line MGBPA. NMOS transistor 42AR<0> has a source connected to negative-side voltage line MGBNA. PMOS transistor 41AR<0> and NMOS transistor 42AR<0> each have a drain connected together, and a node between them is connected to memory gate line MGAR<0>.

MG driver 400AR<1> is an inverter formed of a PMOS transistor 41AR<1> and an NMOS transistor 42AR<1>. PMOS transistor 41AR<1> and NMOS transistor 42AR<1> each have a gate connected to gate voltage line MGGR<1>. PMOS transistor 41AR<1> has a source connected to positive-side voltage line MGBPA. NMOS transistor 42AR<1> has a source connected to negative-side voltage line MGBNA. PMOS transistor 41AR<1> and NMOS transistor 42AR<1> each have a drain connected together, and a node between them is connected to memory gate line MGAR<1>.

MG driver 400BR<0> is an inverter formed of a PMOS transistor 41BR<0> and an NMOS transistor 42BR<0>. PMOS transistor 41BR<0> and NMOS transistor 42BR<0> each have a gate connected to gate voltage line MGGR<0>. PMOS transistor 41BR<0> has a source connected to positive-side voltage line MGBPB. NMOS transistor 42BR<0> has a source connected to negative-side voltage line MGBNB. PMOS transistor 41BR<0> and NMOS transistor 42BR<0> each have a drain connected together, and a node between them is connected to memory gate line MGBR<0>.

MG driver 400BR<1> is an inverter formed of a PMOS transistor 41BR<1> and an NMOS transistor 42BR<1>. PMOS transistor 41BR<1> and NMOS transistor 42BR<1> each have a gate connected to gate voltage line MGGR<1>. PMOS transistor 41BR<1> has a source connected to positive-side voltage line MGBPB. NMOS transistor 42BR<1> has a source connected to negative-side voltage line MGBNB. PMOS transistor 41BR<1> and NMOS transistor 42BR<1> each have a drain connected together, and a node between them is connected to memory gate line MGBR<1>.

An MG holding circuit 91L for left memory mat 1L includes NMOS transistors 91AL<0> and 91AL<1> included in block A, and NMOS transistors 91BL<0> and 91BL<1> included in block B.

NMOS transistor 91AL<0> has a gate connected to a gate voltage line MGFIXG. NMOS transistor 91AL<0> has a drain connected to memory gate line MGAL<0>. NMOS transistor 91AL<0> has a source connected to a source voltage line MGFIXD. NMOS transistor 91AL<1> has a gate connected to gate voltage line MGFIXG. NMOS transistor 91AL<1> has a drain connected to memory gate line MGAL<1>. NMOS transistor 91AL<1> has a source connected to source voltage line MGFIXD. NMOS transistor 91BL<0> has a gate connected to gate voltage line MGFIXG. NMOS transistor 91BL<0> has a drain connected to memory gate line MGBL<0>. NMOS transistor 91BL<0> has a source connected to source voltage line MGFIXD. NMOS transistor 91BL<1> has a gate connected to gate voltage line MGFIXG. NMOS transistor 91BL<1> has a drain connected to memory gate line MGBL<1>. NMOS transistor 91BL<1> has a source connected to source voltage line MGFIXD.

By providing such NMOS transistors 91AL<0>, 91AL<1>, 91BL<0>and 91BL<1>, noise on memory gate lines MGAL<0>, MGAL<1>MGBL<0>and MGBL<1>caused by coupling to the control gate line during reading can be suppressed, thus allowing the voltages to be fixed at a voltage of source voltage line MGFIXD.

An MG holding circuit 91R for right memory mat 1R includes NMOS transistors 91AR<0> and 91AR<1> included in block A, and NMOS transistors 91BR<0> and 91BR<1> included in block B.

NMOS transistor 91AR<0> has a gate connected to gate voltage line MGFIXG. NMOS transistor 91AR<0> has a drain connected to memory gate line MGAR<0>. NMOS transistor 91AR<0> has a source connected to source voltage line MGFIXD. NMOS transistor 91AR<1> has a gate connected to gate voltage line MGFIXG. NMOS transistor 91AR<1> has a drain connected to memory gate line MGAR<1>. NMOS transistor 91AR<1> has a source connected to source voltage line MGFIXD. NMOS transistor 91BR<0> has a gate connected to gate voltage line MGFIXG. NMOS transistor 91BR<0> has a drain connected to memory gate line MGBR<0>. NMOS transistor 91BR<0> has a source connected to source voltage line MGFIXD. NMOS transistor 91BR<1> has a gate connected to gate voltage line MGFIXG. NMOS transistor 91BR<1> has a drain connected to memory gate line MGBR<1>. NMOS transistor 91BR<1> has a source connected to source voltage line MGFIXD.

By providing such NMOS transistors 91AR<0>, 91AR<1>, 91BR<0>and 91BR<1>, noise on memory gate lines MGAR<0>, MGAR<1>, MGBR<0>and MGBR<1>caused by coupling to the control gate line during reading can be suppressed, thus allowing the voltages to be fixed at the voltage of source voltage line MGFIXD.

During writing, all of NMOS transistors 91AR<0>, 91AR<1>, 91BR<0> and 91BR<1> need to be turned off. Thus, source voltage line MGFIXD is set to VSS and gate voltage line MGFIXG is set to VEEu.

The substrate potential of each of PMOS transistors 41AL<0>, 41AL<1>, 41BL<0>, 41BL<1>, 41AR<0>, 41AR<1>, 41BR<0> and 41BR<1> is set to a maximum voltage within the semiconductor device, and is set to VPPs during writing.

The substrate potential of each of NMOS transistors 42AL<0>, 42AL<1>, 42BL<0>, 42BL<1>, 42AR<0>, 42AR<1>, 42BR<0>, 42BR<1>, 91AL<0>, 91AL<1>, 91BL<0>, 91BL<1>, 91AR<0>, 91AR<1>, 91BR<0> and 91BR<1> is set to a minimum voltage within the semiconductor device. During writing, this substrate potential is set to VEEu=VSS.

Figure 8:
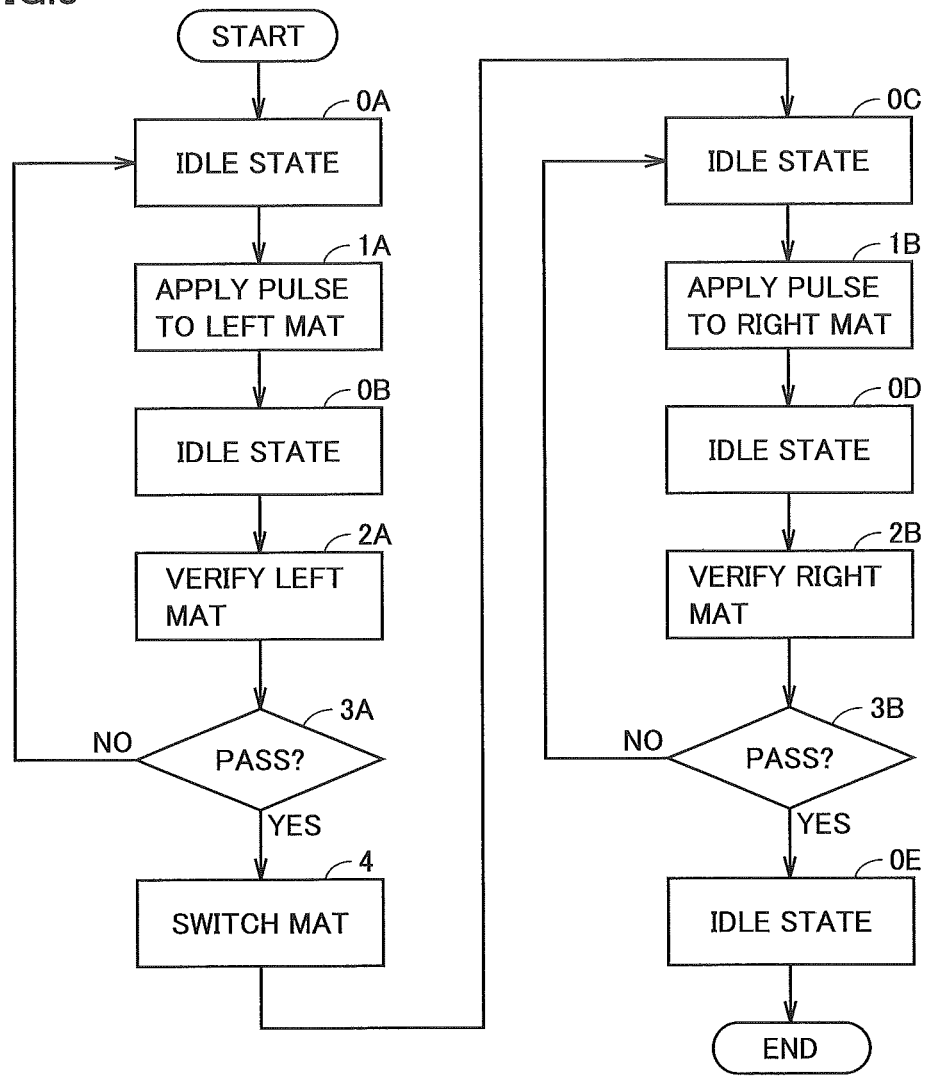
FIG. 8 is a flowchart illustrating a procedure of a write sequence when writing into memory cells on a single row is performed.

FIG. 8 is a flowchart illustrating a procedure of a write sequence when writing into memory cells on a single row is performed.

Referring to FIG. 8, a step 0A is an idle state in which all memory cells are non-selected.

In a step 1A, memory gate line MGL of left memory mat 1L is selected, and sense amplifier/write control circuit 6L causes a write pulse to be applied to left memory mat 1L based on write data WD that has been input to external data input/output terminal 15.

In a step 0B, the process returns to the idle state in which all memory cells are non-selected.

In a step 2A, in order to verify whether or not data has been written into the memory cells of left memory mat 1L, memory gate line MGL of left memory mat 1L is selected, and sense amplifier/write control circuit 6L causes verify to be performed.

When the verify passes in a step 3A, the process proceeds to a step 4, and when the verify fails, the process returns to step 0A.

In step 4, a mat subjected to writing is switched to right memory mat 1R.

In a step 0C, the process returns to the idle state in which all memory cells are non-selected.

In a step 1B, memory gate line MGR of right memory mat 1R is selected, and sense amplifier/write control circuit 6R causes a write pulse to be applied to right memory mat 1R based on write data WD that has been input to external data input/output terminal 15.

In a step 0D, the process returns to the idle state in which all memory cells are non-selected.

In a step 2B, in order to verify whether or not data has been written into the memory cells of right memory mat 1R, memory gate line MGR of right memory mat 1R is selected, and sense amplifier/write control circuit 6L causes verify to be performed.

When the verify passes in a step 3B, the process proceeds to a step 0E, and when the verify fails, the process returns to step 0C.

The order of the processing described above is similar to a conventional order. Conventionally, however, the memory gate line is not divided, and therefore, during writing into left memory mat 1L, not only the portion of the memory gate lines connected to the memory cells of left memory mat 1L, but also the portion of the memory gate lines connected to the memory cells of right memory mat 1R are selected. Similarly, during writing into right memory mat 1R, not only the portion of the memory gate lines connected to the memory cells of right memory mat 1R, but also the portion of the memory gate lines connected to the memory cells of left memory mat 1L are selected.

Figure 9:
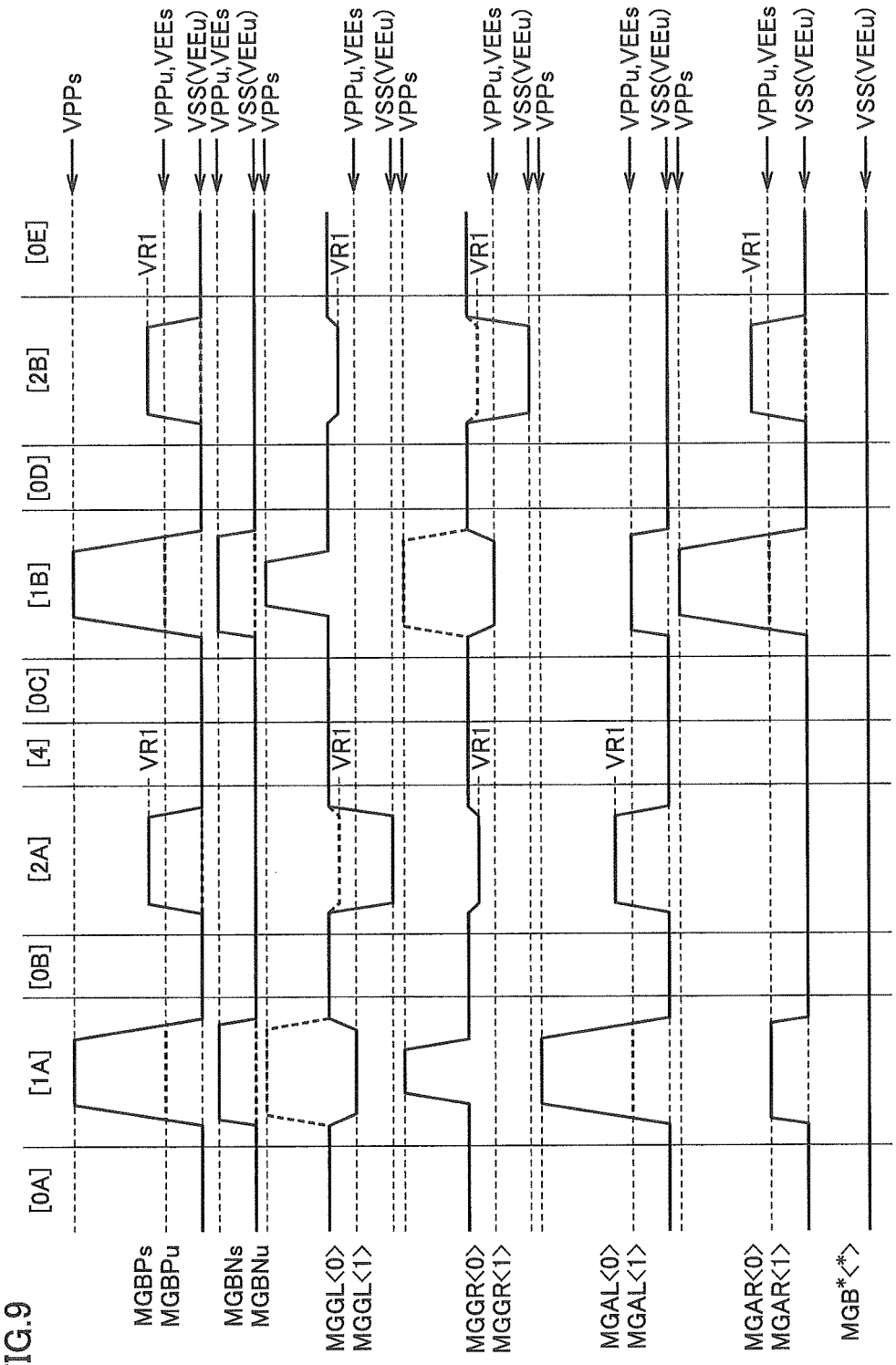
FIG. 9 illustrates transition of voltages of memory gate lines and gate voltage lines, and transition of control voltages in the second embodiment.

FIG. 9 illustrates transition of voltages of the memory gate lines and the gate voltage lines, and transition of the control voltages in the second embodiment.

In FIG. 9, select control voltages MGBPs and MGBNs, and the voltages of gate voltage lines MGGL<0>, MGGR<0>, and memory gate lines MGAL<0>, MGAR<0>, MGB*<*> are indicated by solid lines, while non-select control voltages MGBPu and MGBNu, and the voltages of gate voltages MGGL<1>, MGGR<1>, and memory gate lines MGAL<1>, MGAR<1> are indicated by broken lines. It is noted that MGB*<*> represents all of MGBL<0>, MGBL<1>, MGBR<0> and MGBR<1>.

VPPs, which is indicated at the right end of FIG. 9, is a positive voltage of about 10 V, and VPPu (=VEEs) is a positive voltage of about 3 V. VEEu is at a VSS level.

The voltage transitions will now be described in accordance with the procedure of the flowchart of FIG. 8. A period of time corresponding to each step of the flowchart of FIG. 8 is indicated at the top of FIG. 9.

In step 0A (idle state), all signals are in a non-selected state, MGGL<0>, MGGL<1>, MGGR<0> and MGGR<1> are at a VR1 level, and the other signals are at the VSS (=VEEu) level.

In step 1A (application of the write pulse to left memory mat 1L), first decoder 5-1 causes, regarding control voltages MGBPs, MGBPu, MGBNs and MGBNu, positive-side select control voltage MGBPs to reach a VPPs level, positive-side non-select control voltage MGBPu to reach a VPPu level, negative-side select control voltage MGBNs to reach the VPPu level, and negative-side non-select control voltage MGBNu to maintain the VSS (=VEEu) level.

In addition, second decoder 5-2 and third decoder 5-3 cause, regarding gate voltage lines MGGL<0>, MGGL<1>, MGGR<0> and MGGR<1>, only gate voltage line MGGL<0> of the selected row (0) of selected memory mat 1L to reach the VPPu (=VEEs) level, and the others to reach the VPPs level.

As a result, MG driver circuits 4L and 4R cause, regarding memory gate lines MGAL<0>, MGAL<1>, MGAR<0> and MGAR<1>, only memory gate line MGAL<0> of the selected row (0) of selected block A of selected memory mat 1L to reach the VPPs level (to be activated), and the others to reach the VPPu (=VEEs) level.

In addition, MG driver circuits 4L and 4R cause memory gate lines MGBL<0>, MGBL<1>, MGBR<0> and MGBR<1> of non-selected block B to maintain VSS (=VEEu).

Sense amplifier/write control circuit 6L causes a write pulse to be applied to left memory mat 1L based on write data WD that has been input to external data input/output terminal 15.

Then, the process returns to step 0B (idle state), before proceeding to step 2A. In step 2A (verify of left memory mat 1L), first decoder 5-1 causes, regarding control voltages MGBPs, MGBPu, MGBNs and MGBNu, only positive-side select control voltage MGBPs to reach the VR1 level, and the others to maintain the VSS (=VEEu) level.

In addition, second decoder 5-2 and third decoder 5-3 cause, regarding gate voltage lines MGGL<0>, MGGL<1>, MGGR<0> and MGGR<1>, only gate voltage line MGGL<0> of the selected row (0) of selected memory mat 1L to reach the VSS (=VEEu) level, and the others to reach the VR1 level.

As a result, MG driver circuits 4L and 4R cause, regarding memory gate lines MGAL<0>, MGAL<1>, MGAR<0> and MGAR<1>, only memory gate line MGAL<0> of the selected row (0) of selected block A of selected memory mat 1L to reach the VR1 level, and the others to reach the VSS (=VEEu) level.

In addition, MG driver circuits 4L and 4R cause memory gate lines MGBL<0>, MGBL<1>, MGBR<0> and MGBR<1> of non-selected block B to maintain VSS (=VEEu).

Sense amplifier/write control circuit 6L causes verify of left memory mat 1L to be performed.

Then, after step 4 (switching of the selected memory mat to right memory mat 1R) and step 0C (idle state) are performed, the process proceeds to step 1B.

In step 1B (application of the write pulse to right memory mat 1R), first decoder 5-1 causes, regarding control voltages MGBPs, MGBPu, MGBNs and MGBNu, positive-side select control voltage MGBPs to reach the VPPs level, positive-side non-select control voltage MGBPu to reach the VPPu level, negative-side select control voltage MGBNs to reach the VPPu level, and negative-side non-select control voltage MGBNu to maintain the VSS (=VEEu) level.

In addition, second decoder 5-2 and third decoder 5-3 cause, regarding gate voltage lines MGGL<0>, MGGL<1>, MGGR<0> and MGGR<1>, only gate voltage line MGGR<0> of the selected row (0) of selected memory mat 1R to reach the VPPu (=VEEs) level, and the others to reach the VPPs level.

As a result, MG driver circuits 4L and 4R cause, regarding memory gate lines MGAL<0>, MGAL<1>, MGAR<0> and MGAR<1>, only memory gate line MGAR<0> of the selected row (0) of selected block A of selected memory mat 1R to reach the VPPs level (to be activated), and the others to reach the VPPu (=VEEs) level.

In addition, MG driver circuits 4L and 4R cause memory gate lines MGBL<0>, MGBL<1>, MGBR<0> and MGBR<1> of non-selected block B to maintain VSS (=VEEu).

Sense amplifier/write control circuit 6L causes a write pulse to be applied to right memory mat 1R based on write data WD that has been input to external data input/output terminal 15.

Then, the process returns to step 0D (idle state), before proceeding to step 2B.

In step 2B (verify of right memory mat 1R), first decoder 5-1 causes, regarding control voltages MGBPs, MGBPu, MGBNs and MGBNu, only positive-side select control voltage MGBPs to reach the VR1 level, and the others to maintain the VSS (=VEEu) level.

In addition, second decoder 5-2 and third decoder 5-3 cause, regarding gate voltage lines MGGL<0>, MGGL<1>, MGGR<0> and MGGR<1>, only gate voltage line MGGR<0> of the selected row (0) of selected memory mat 1R to reach the VSS (=VEEu) level, and the others to reach the VR1 level.

As a result, MG driver circuits 4L and 4R cause, regarding memory gate lines MGAL<0>, MGAL<1>, MGAR<0> and MGAR<1>, only memory gate line MGAR<0> of the selected row (0) of selected block A of selected memory mat 1R to reach the VR1 level, and the others to reach the VSS (=VEEu) level.

In addition, MG driver circuits 4L and 4R cause memory gate lines MGBL<0>, MGBL<1>, MGBR<0> and MGBR<1> of non-selected block B to maintain VSS (=VEEu).

Sense amplifier/write control circuit 6R causes verify of right memory mat 1R to be performed.

Then, the process returns to step 0E (idle state), and the write sequence ends. As described above, in the present embodiment, by dividing the memory gate line between the left memory mat and the right memory mat, and controlling the lines individually, the memory gate lines other than those of a memory mat including the memory cell subjected to writing can be brought into a non-selected state during writing. Accordingly, the time to select memory gates connected to non-selected memory cells is reduced in half, thereby reducing erroneous writing or erroneous erasure caused by a disturb.

Moreover, in the present embodiment, the control gate line is also divided to make it shorter, thereby allowing a fast rise of the control gate line to perform high-speed reading.

The CG driver that drives the control gate line of the left memory mat is disposed on the right side of the left memory mat, the CG driver that drives the control gate line of the right memory mat is disposed on the left side of the right memory mat, and the low-voltage decode circuit that controls these CG drivers is disposed between these CG drivers. With the two CD drivers being disposed in proximity to the low-voltage decoder, the control gate line of the left memory mat and the control gate line of the right memory mat can be raised fast, while the difference in timing at which the voltages of these control gate lines vary can be reduced.

The MG driver that drives the memory gate line of the left memory mat is disposed on the left side of the left memory mat, the MG driver that drives the memory gate line of the right memory mat is disposed on the right side of the right memory mat, and the high-voltage decode circuit that controls these MG drivers is disposed on the right side of the MG driver of the right memory mat. Accordingly, the high-voltage decode circuit to which a high voltage is applied can be located distant from the low-voltage decode circuit to which a low voltage is applied.

[Third Embodiment]

Figure 10:
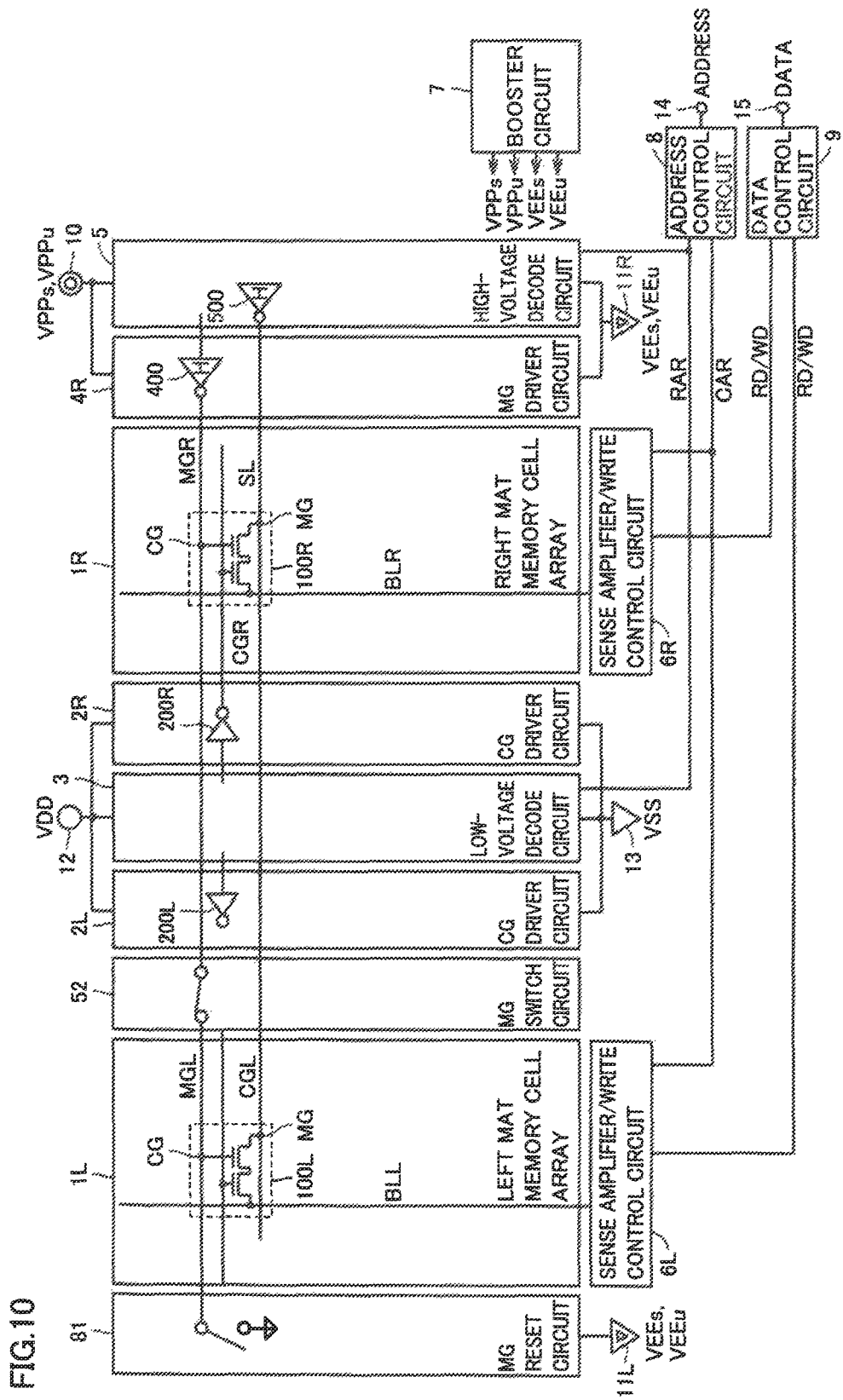
FIG. 10 illustrates a configuration of a semiconductor device of a third embodiment.

FIG. 10 illustrates a configuration of a semiconductor device of a third embodiment.

This semiconductor device is different from the semiconductor device of the second embodiment in that it includes an MG switch circuit 52. MG switch circuit 52 connects or disconnects memory gate line MGL of left memory mat 1L and memory gate line MGR of right memory mat 1R.

This semiconductor device also includes, instead of MG driver circuit 4L for left memory mat 1L included in the semiconductor device of the second embodiment, an MG reset circuit 81 for causing memory gate lines MGAL and MGBL of left mat 1L to make a transition to a non-selected voltage.

Figure 11:
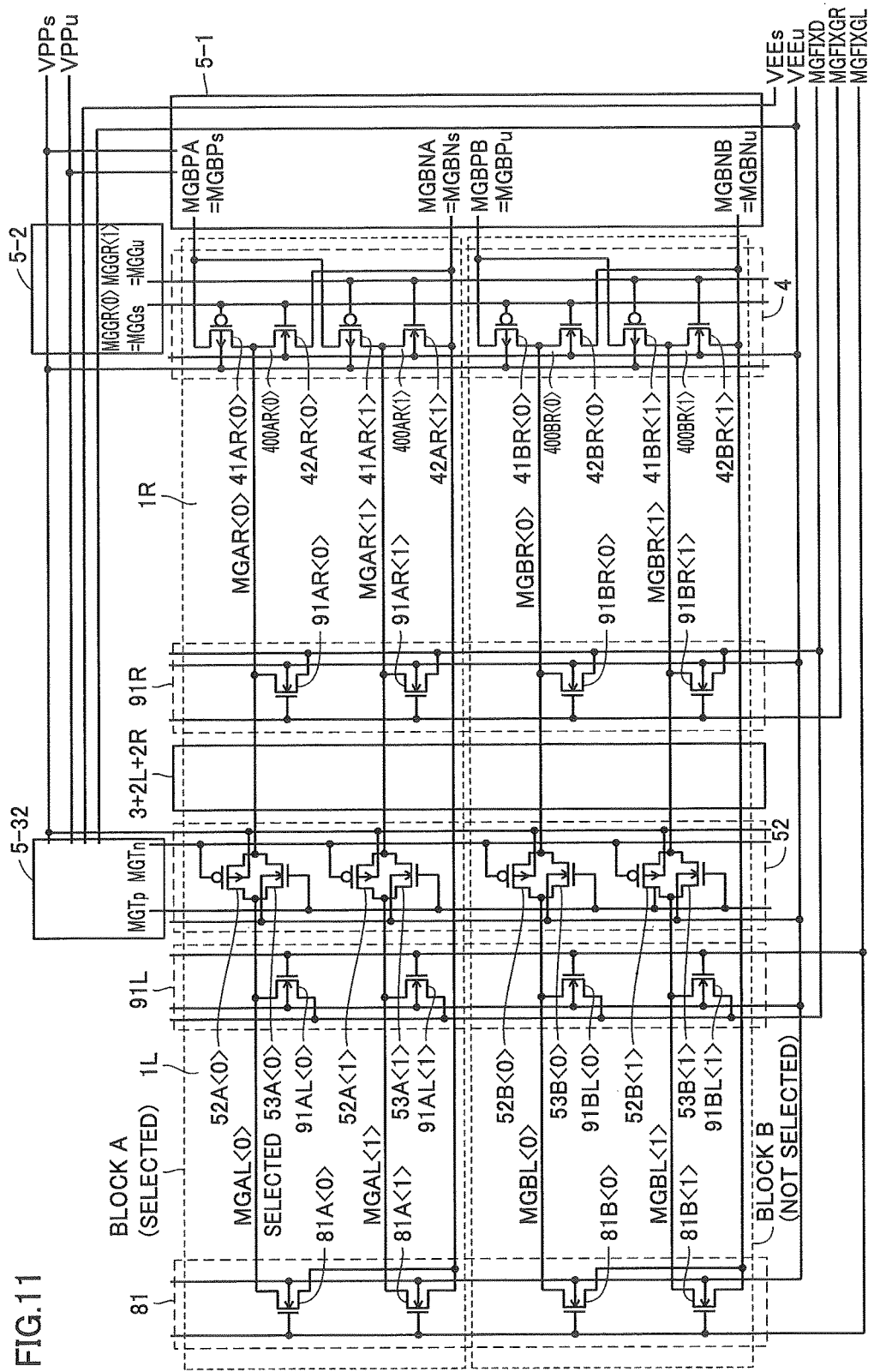
FIG. 11 shows a detailed configuration of the semiconductor device of the third embodiment.

FIG. 11 shows a detailed configuration of the semiconductor device of the third embodiment.

Memory cells 100L, 100R, control gate lines CGL, CGR, source line SL, and bit lines BLL, BLR are omitted in FIG. 11.

MG switch circuit 52 is disposed between CG driver circuit 2L of left memory mat 1L and MG holding circuit 91L of left memory mat 1L.

In the second embodiment, positive-side voltage lines MGBPA and MGBPB, and negative-side voltage lines MGBNA and MGBNB are connected to MG driver circuits 4L and 4R. Thus, positive-side voltage lines MGBPA and MGBPB, and negative-side voltage lines MGBNA and MGBNB need to extend across memory arrays 1L and 1R. In the third embodiment, on the other hand, MG reset circuit 81 does not use a positive power supply. Thus, only negative-side voltage lines MGBNA and MGBNB extend across memory arrays 1L and 1R. Positive-side voltage lines MGBPA and MGBPB are connected only to MG driver circuit 4R of right memory mat 1R.

MG driver circuit 4R is disposed, as in the second embodiment, outside the region surrounding both left mat memory cell array 1L and right mat memory cell array 1R, at a position adjacent to right mat memory cell array 1R. Specifically, MG driver circuit 4R is disposed adjacent to and on the right side of right mat memory cell array 1R.

First decoder 5-1 supplies, as in the second embodiment, positive-side select control voltage MGBPs and negative-side select control voltage MGBNs to positive-side voltage line MGBPA and negative-side voltage line MGBNA included in selected block A, respectively. First decoder 5-1 supplies positive-side non-select control voltage MGBPu and negative-side non-select control voltage MGBNu to positive-side voltage line MGBPB and negative-side voltage line MGBNB included in non-selected block B, respectively. First decoder 5-1 is disposed adjacent to MG driver circuit 4R.

Further, in the second embodiment, NMOS transistors 91AL<0>, 91AL<1>, 91BL<0>, 91BL<1>, 91AR<0>, 91AR<1>, 91BR<0> and 91BR<1> included in MG holding circuits 91L and 91R each have a gate connected to gate voltage line MGFIXG.

In contrast, in the third embodiment, NMOS transistors 91AL<0>, 91AL<1>, 91BL<0> and 91BL<1> included in MG holding circuit 91L of left memory mat 1L, and NMOS transistors 81A<0>, 81A<1>, 81B<0> and 81B<1> included in MG reset circuit 81 each have a gate connected to gate voltage line MGFIXGL. In addition, 91AR<0>, 91AR<1>, 91BR<0> and 91BR<1> included in MG holding circuit 91R of right memory mat 1R each have a gate connected to gate voltage line MGFIXGR.

This semiconductor device includes, instead of third decoder 5-3 included in the semiconductor device of the second embodiment, a third decoder 5-32 (switch control circuit).

Third decoder 5-32 supplies switch signals MGTp and MGTn, which are complementary signals common to the blocks, to MG switch circuit 52.

MG switch circuit 52 includes a PMOS transistor 52A<0>, an NMOS transistor 53A<0>, a PMOS transistor 52A<1> and an NMOS transistor 53A<1> included in block A, and a PMOS transistor 52B<0>, an NMOS transistor 53B<0>, a PMOS transistor 52B<1> and an NMOS transistor 53B<1> included in block B.

PMOS transistor 52A<0> and NMOS transistor 53A<0> form a CMOS (Complementary MOS) transfer gate. PMOS transistor 52A<0> and NMOS transistor 53A<0> are provided between one end of memory gate line MGAL<0> of left memory mat 1L and one end of memory gate line MGAR<0> of right memory mat 1R. PMOS transistor 52A<0> has a gate receiving switch signal MGTn. NMOS transistor 53A<0> has a gate receiving switch signal MGTp.

PMOS transistor 52A<1> and NMOS transistor 53A<1> form a CMOS transfer gate. PMOS transistor 52A<1> and NMOS transistor 53A<1> are provided between one end of memory gate line MGAL<1> of left memory mat 1L and one end of memory gate line MGAR<1> of right memory mat 1R. PMOS transistor 52A<1> has a gate receiving switch signal MGTn. NMOS transistor 53A<1> has a gate receiving switch signal MGTp.

PMOS transistor 52B<0> and NMOS transistor 53B<0> form a CMOS transfer gate. PMOS transistor 52B<0> and NMOS transistor 53B<0> are provided between one end of memory gate line MGBL<0> of left memory mat 1L and one end of memory gate line MGBR<0> of right memory mat 1R. PMOS transistor 52B<0> has a gate receiving switch signal MGTn. NMOS transistor 53B<0> has a gate receiving switch signal MGTp.

PMOS transistor 52B<1> and NMOS transistor 53B<1> form a CMOS transfer gate. PMOS transistor 52B<1> and NMOS transistor 53B<1> are provided between one end of memory gate line MGBL<1> of left memory mat 1L and one end of memory gate line MGBR<1> of right memory mat 1R. PMOS transistor 52B<1> has a gate receiving switch signal MGTn. NMOS transistor 53B<1> has a gate receiving switch signal MGTp.

MG reset circuit 81 includes NMOS transistors 81A<0> and 81A<1> included in block A, and NMOS transistors 81B<0> and 81B<1> included in block B.

NMOS transistor 81A<0> has a gate connected to gate voltage line MGFIXGL. NMOS transistor 81A<0> has a drain connected to memory gate line MGAL<0>. NMOS transistor 81A<0> has a source connected to negative-side voltage line MGBNA.

NMOS transistor 81A<1> has a gate connected to gate voltage line MGFIXGL. NMOS transistor 81A<1> has a drain connected to memory gate line MGAL<1>. NMOS transistor 81A<1> has a source connected to negative-side voltage line MGBNA.

NMOS transistor 81B<0> has a gate connected to gate voltage line MGFIXGL. NMOS transistor 81B<0> has a drain connected to memory gate line MGBL<0>. NMOS transistor 81B<0> has a source connected to negative-side voltage line MGBNB.

NMOS transistor 81B<1> has a gate connected to gate voltage line MGFIXGL. NMOS transistor 81B<1> has a drain connected to memory gate line MGBL<1>. NMOS transistor 81B<1> has a source connected to negative-side voltage line MGBNB.

Figure 12:
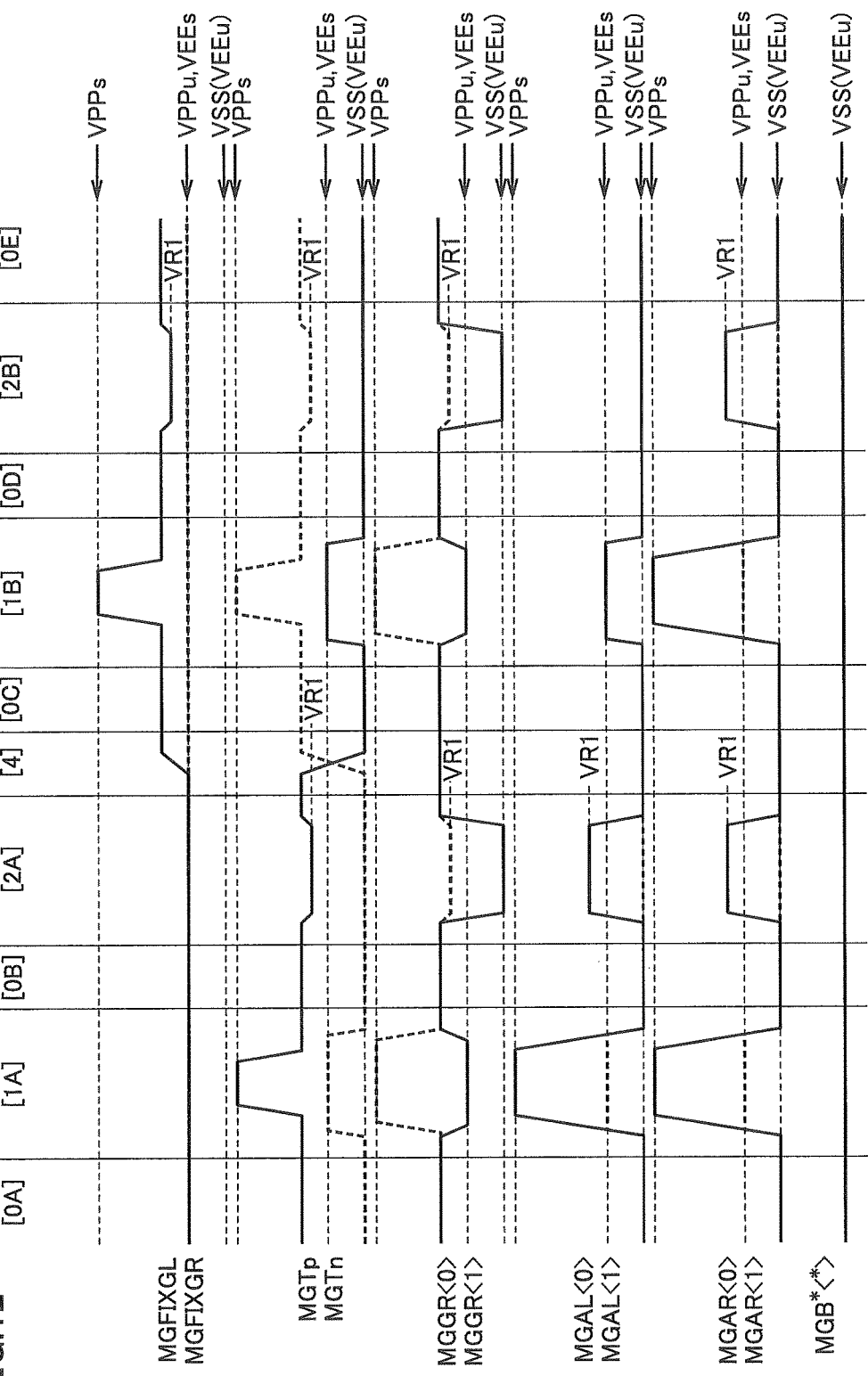
FIG. 12 illustrates transition of voltages of memory gate lines and gate voltage lines, and transition of control voltages in the third embodiment.

FIG. 12 illustrates transition of voltages of the memory gate lines and the gate voltage lines, and transition of the control voltages in the third embodiment.

FIG. 12 only illustrates voltages changed from, and added to, those in the second embodiment. Thus, positive-side voltages MGBPs, MGBPu and negative-side voltages MGBNs, MGBNu not illustrated make the same transitions as those in FIG. 9.

In FIG. 12, the voltages of gate voltage line MGFIXGL, switch signal MGTp, gate voltage line MGGR<0>, and memory gate lines MGAL<0>, MGAR<0>, MGB*<*> are indicated by solid lines, while the voltages of gate voltage line MGFIXGR, switch signal MGTn, gate voltage line MGGR<1>, and memory gate lines MGAL<1>, MGAR<1>, MGB*<*> are indicated by broken lines.

The voltage transitions will now be described in accordance with the procedure of the flowchart of FIG. 8. A period of time corresponding to each step of the flowchart of FIG. 8 is indicated at the top of FIG. 12.

In step 0A (idle state), all signals are in a non-selected state, MGTP, MGGR<0> and MGGR<1> are at the VR1 level, MGFIXGL and MGFIXGR are at the VPPu (=VEEs) level, and the other signals are at the VSS (=VEEu) level.

In step 1A (application of the write pulse to left memory mat 1L), first decoder 5-1 causes, regarding control voltages MGBPs, MGBPu, MGBNs and MGBNu, positive-side select control voltage MGBPs to reach the VPPs level, positive-side non-select control voltage MGBPu to reach the VPPu level, negative-side select control voltage MGBNs to reach the VPPu level, and negative-side non-select control voltage MGBNu to maintain the VSS (=VEEu) level.

In addition, second decoder 5-2 causes, regarding gate voltage lines MGGR<0> and MGGR<1>, gate voltage line MGGR<0> of the selected row (0) to reach the VPPu (=VEEs) level, and the other to reach the VPPs level.

In addition, third decoder 5-32 causes switch signal MGTp to reach the VPPs level, and switch signal MGTn to reach the VPPu (=VEEs) level. Consequently, NMOS transistors 53A<0>, 53A<1>, 53B<0>, 53B<1> and PMOS transistors 52A<0>, 52A<1>, 52B<0>, 52B<1> included in MG switch circuit 52 are all turned on. As a result, memory gate lines MGAL<0> and MGAR<0> are connected together, memory gate lines MGAL<1> and MGAR<1> are connected together, memory gate lines MGBL<0> and MGBR<0> are connected together, and memory gate lines MGBL<1> and MGBR<1> are connected together.

As such, MG driver circuit 4R causes, regarding memory gate lines MGAL<0>, MGAL<1>, MGAR<0> and MGAR<1>, only memory gate lines MGAL<0> and MGAR<0> of the selected row (0) of selected block A of both memory mats (1L, 1R) to reach the VPPs level (to be activated), and the others to reach the VPPu (=VEEs) level. In addition, MG driver circuit 4R causes memory gate lines MGBL<0>, MGBL<1>, MGBR<0> and MGBR<1> of non-selected block B to maintain VSS (=VEEu).

Sense amplifier/write control circuit 6L causes a write pulse to be applied to left memory mat 1L based on write data WD that has been input to external data input/output terminal 15.

Then, the process returns to step 0B (idle state), before proceeding to step 2A.

In step 2A (verify of left memory mat 1L), first decoder 5-1 causes, regarding control voltages MGBPs, MGBPu, MGBNs and MGBNu, only positive-side select control voltage MGBPs to reach the VR1 level, and the others to maintain the VSS (=VEEu) level.

In addition, second decoder 5-2 causes, regarding gate voltage lines MGGR<0> and MGGR<1>, gate voltage line MGGR<0> of the selected row (0) to reach the VSS (=VEEu) level, and the other to reach the VR1 level.

In addition, third decoder 5-32 causes switch signal MGTp to reach the VR1 level, and switch signal MGTn to reach the VSS (=VEEu) level.

Consequently, NMOS transistors 53A<0>, 53A<1>, 53B<0> and 53B<1> included in MG switch circuit 52 are turned off, and PMOS transistors 52A<0>, 52A<1>, 52B<0> and 52B<1> are turned on. As a result, the connection between memory gate lines MGAL<0> and MGAR<0> is maintained, the connection between memory gate lines MGAL<1> and MGAR<1> is maintained, the connection between memory gate lines MGBL<0> and MGBR<0> is maintained, and the connection between memory gate lines MGBL<1> and MGBR<1> is maintained.

As such, MG driver circuit 4R causes, regarding memory gate lines MGAL<0>, MGAL<1>, MGAR<0> and MGAR<1>, only memory gate lines MGAL<0> and MGAR<0> of the selected row (0) of selected block A of both memory mats (1L, 1R) to reach the VR1 level, and the others to reach the VSS (=VEEu) level. In addition, MG driver circuit 4R causes memory gate lines MGBL<0>, MGBL<1>, MGBR<0> and MGBR<1> of non-selected block B to maintain VSS (=VEEu).

Sense amplifier/write control circuit 6L causes verify of left memory mat 1L to be performed.

Then, after step 4 (switching of the selected memory mat to right memory mat 1R) and step 0C (idle state) are performed, the process proceeds to step 1B.

In step 1B (application of the write pulse to right memory mat 1R), first decoder 5-1 causes, regarding control voltages MGBPs, MGBPu, MGBNs and MGBNu, positive-side select control voltage MGBPs to reach the VPPs level, positive-side non-select control voltage MGBPu to reach the VPPu level, negative-side select control voltage MGBNs to reach the VPPu level, and negative-side non-select control voltage MGBNu to maintain the VSS (=VEEu) level.

In addition, second decoder 5-2 causes, regarding gate voltage lines MGGR<0> and MGGR<1>, gate voltage line MGGR<0> of the selected row (0) to reach the VPPu (=VEEs) level, and the other to reach the VPPs level.

In addition, third decoder 5-32 causes switch signal MGTp to reach the VPPu (=VEEs) level, and switch signal MGTn to reach the VPPs level. Consequently, NMOS transistors 53A<0>, 53A<1>, 53B<0>, 53B<1> and PMOS transistors 52A<0>, 52A<1>, 52B<0>, 52B<1> included in MG switch circuit 52 are all turned off. As a result, memory gate lines MGAL<0> and MGAR<0> are disconnected from each other, memory gate lines MGAL<1> and MGAR<1> are disconnected from each other, memory gate lines MGBL<0> and MGBR<0> are disconnected from each other, and memory gate lines MGBL<1> and MGBR<1> are disconnected from each other.

In addition, gate voltage MGFIXGL is set to the VPPs level. Consequently, NMOS transistors 81A<0> and 81A<1> in MG reset circuit 81 cause the voltages of memory gate lines MGAL<0> and MGAL<1> of selected block A of left memory mat 1L to be discharged and fixed at the negative-side select control voltage MGBNs (=VPPu) level. In addition, NMOS transistors 81B<0> and 8BA<1> in MG reset circuit 81 cause the voltages of memory gate lines MGBL<0> and MGBL<1> of non-selected block B of left memory mat 1L to be discharged and fixed at the negative-side non-select control voltage MGBNu (=VSS) level.

As such, MG driver circuit 4R causes, regarding memory gate lines MGAL<0>, MGAL<1>, MGAR<0> and MGAR<1>, only memory gate MGAR<0> of the selected row (0) of selected block A of right memory mat 1R to reach the VPPs level (to be activated), and the others to reach the VPPu (=VEEs) level. In addition, MG driver circuit 4R causes memory gate lines MGBL<0>, MGBL<1>, MGBR<0> and MGBR<1> of non-selected block B to maintain VSS (=VEEu).

Sense amplifier/write control circuit 6R causes a write pulse to be applied to right memory mat 1R based on write data WD that has been input to external data input/output terminal 15.

Then, the process returns to step 0D (idle state), before proceeding to step 2B. In step 2B (verify of right memory mat 1R), first decoder 5-1 causes, regarding control voltages MGBPs, MGBPu, MGBNs and MGBNu, only positive-side select control voltage MGBPs to reach the VR1 level, and the others to maintain the VSS (=VEEu) level.

In addition, second decoder 5-2 causes, regarding gate voltage lines MGGR<0> and MGGR<1>, gate voltage line MGGR<0> of the selected row (0) to reach the VSS (=VEEu) level, and the other to reach the VR1 level.

In addition, third decoder 5-32 causes switch signal MGTp to reach the VSS (=VEEu) level, and switch signal MGTn to reach the VR1 level.

Consequently, NMOS transistors 53A<0>, 53A<1>, 53B<0>, 53B<1> and PMOS transistors 52A<0>, 52A<1>, 52B<0>, 52B<1> included in MG switch circuit 52 are all turned off. As a result, the disconnection between memory gate lines MGAL<0> and MGAR<0> is maintained, the disconnection between memory gate lines MGAL<1> and MGAR<1> is maintained, the disconnection between memory gate lines MGBL<0> and MGBR<0> is maintained, and the disconnection between memory gate lines MGBL<1> and MGBR<1> is maintained.

As such, MG driver circuit 4R causes, regarding memory gate lines MGAL<0>, MGAL<1>, MGAR<0> and MGAR<1>, only memory gate line MGAR<0> of the selected row (0) of selected block A of right memory mat 1R to reach the VR1 level, and the others to reach the VSS (=VEEu) level. In addition, MG driver circuit 4R causes memory gate lines MGBL<0>, MGBL<1>, MGBR<0> and MGBR<1> of non-selected block B to maintain VSS (=VEEu).

Sense amplifier/write control circuit 6R causes verify of right memory mat 1R to be performed.

In the above operation, it appears that disturb stress can be reduced in left memory mat 1L as in the second embodiment, whereas disturb stress is applied to right memory mat 1R. This is not true, however.

Disturb includes loss where a "write" cell changes to an "erase" cell, and gain where an "erase" cell changes to a "write" cell. Generally, when a positive high voltage is applied to a memory gate line during writing, both the gain disturb and the loss disturb occur. However, by adjusting the voltage of a source line and the like, and by modifying the structure of a memory cell, the effect of either the gain or the loss can be increased and the other effect can be reduced.

Specifically, the present embodiment employs, instead of a memory cell configured such that BTBT erasure can be performed by applying a negative high voltage to a memory gate as in FIG. 3(c), a memory cell configured such that FN erasure can be performed by applying a positive high voltage to a memory gate as in FIG. 3(d). In this case, the potential relation in an erase state approximates to the potential relation during a write disturb of FIG. 3(b), in which the effect of the loss increases and the effect of the gain can be substantially ignored. Moreover, since all memory cells are initially in an erase state, even if the loss disturb is applied to right memory mat 1R during writing into left memory mat 1L, there is no change in the state of the memory cell. Therefore, the effect of reducing the disturb stress can be provided in the third embodiment, as in the second embodiment.

As described above, according to the present embodiment, only negative-side voltage line MGBN needs to extend across the memory cell array, thereby reducing in half the voltage line routed over the memory array, to reduce the layout area.

Moreover, in the present embodiment, only the MG driver on the right side of right memory mat 1R is used, and the MG driver on the left side of left memory mat 1L is not required, thereby reducing the layout area.

Furthermore, there is no need to route a line for transmitting a row address signal to the MG driver on the left side of right memory mat 1R, thereby reducing the signal lines.

[Fourth Embodiment]

The overall configuration of a semiconductor device of the present embodiment is similar to the overall configuration of the semiconductor device of the second embodiment shown in FIG. 10. Thus, the description of the overall configuration will not be repeated.

Figure 13:
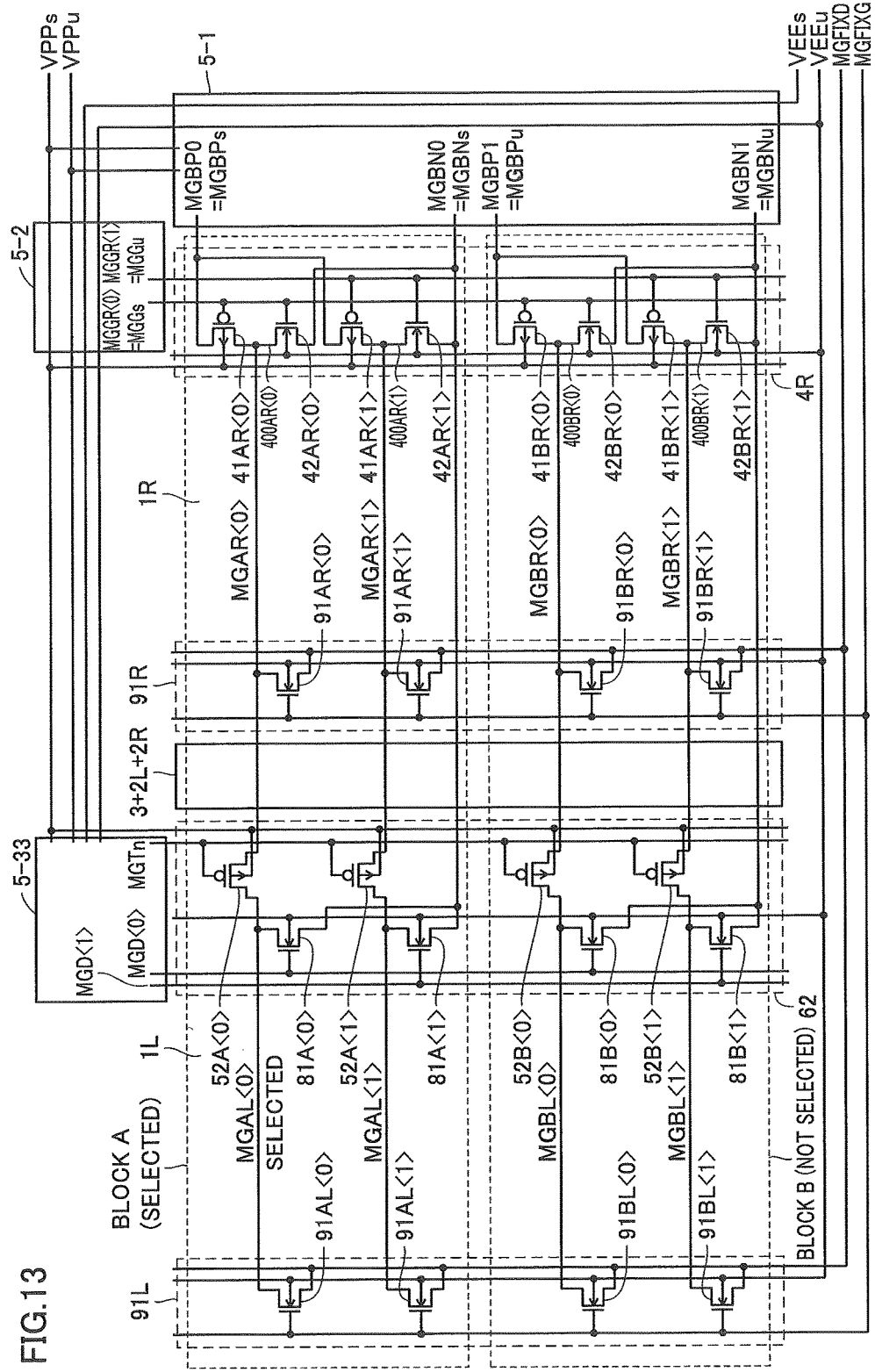
FIG. 13 shows a detailed configuration of a semiconductor device of a fourth embodiment.

FIG. 13 shows a detailed configuration of the semiconductor device of the fourth embodiment.

Memory cells 100L, 100R, control gate lines CGL, CGR, source line SL, and bit lines BLL, BLR are omitted in FIG. 13.

While gate voltage lines MGFIXGL and MGFIXGR are provided in the third embodiment, a single gate voltage line MGFIXGL is provided in the present embodiment as in the second embodiment. Further, the present embodiment includes an MG switch and reset circuit 62 instead of MG switch circuit 52 and reset circuit 81 of the third embodiment.

MG switch and reset circuit 62 includes PMOS transistors 52A<0> and 52A<1> included in block A and PMOS transistors 52B<0> and 52B<1> included in block B, as with MG switch circuit 52 of the third embodiment, but does not include NMOS transistors 53A<0>, 53A<1>, 53B<0> and 53B<1>.

MG switch and reset circuit 62 further includes NMOS transistors 81A<0>, 81A<1>, 81B<0> and 81B<1> included in reset circuit 81 of the third embodiment.

PMOS transistor 52A<0> is provided between one end of memory gate line MGAL<0> of left memory mat 1L and one end of memory gate line MGAR<0> of right memory mat 1R. PMOS transistor 52A<0> has a gate receiving switch signal MGTn.

PMOS transistor 52A<1> is provided between one end of memory gate line MGAL<1> of left memory mat 1L and one end of memory gate line MGAR<1> of right memory mat 1R. PMOS transistor 52A<1> has a gate receiving switch signal MGTn.

PMOS transistor 52B<0> is provided between one end of memory gate line MGBL<0> of left memory mat 1L and one end of memory gate line MGBR<0> of right memory mat 1R. PMOS transistor 52B<0> has a gate receiving switch signal MGTn.

PMOS transistor 52B<1> is provided between one end of memory gate line MGBL<1> of left memory mat 1L and one end of memory gate line MGBR<1> of right memory mat 1R. PMOS transistor 52B<1> has a gate receiving switch signal MGTn.

NMOS transistor 81A<0> has a gate receiving a gate signal MGD<0>. NMOS transistor 81A<0> has a drain connected to memory gate line MGAL<0>. NMOS transistor 81A<0> has a source connected to negative-side voltage line MGBNA.

NMOS transistor 81A<1> has a gate receiving a gate signal MGD<1>. NMOS transistor 81A<1> has a drain connected to memory gate line MGAL<1>. NMOS transistor 81A<1> has a source connected to negative-side voltage line MGBNA.

NMOS transistor 81B<0> has a gate receiving gate signal MGD<0>. NMOS transistor 81B<0> has a drain connected to memory gate line MGBL<0>. NMOS transistor 81B<0> has a source connected to negative-side voltage line MGBNB.

NMOS transistor 81B<1> has a gate receiving gate signal MGD<1>. NMOS transistor 81B<1> has a drain connected to memory gate line MGBL<1>. NMOS transistor 81B<1> has a source connected to negative-side voltage line MGBNB.

This semiconductor device includes, instead of third decoder 5-3 included in the semiconductor device of the second embodiment, a third decoder 5-33 (switch control circuit).

Third decoder 5-33 supplies switch signal MGTn and gate signals MGD<0>, MGD<1> to MG switch and reset circuit 62.

MG switch and reset circuit 62 is disposed between CG driver circuit 2L of left memory mat 1L, and left memory mat 1L.

In the present embodiment, MG holding circuit 91L is disposed on the left side of left mat memory array 1L. This MG holding circuit 91L is connected to gate voltage line MGFIXG, as in the second embodiment. Gate voltage line MGFIXG is set to a fixed value during reading, as in the second embodiment.

Figure 14:
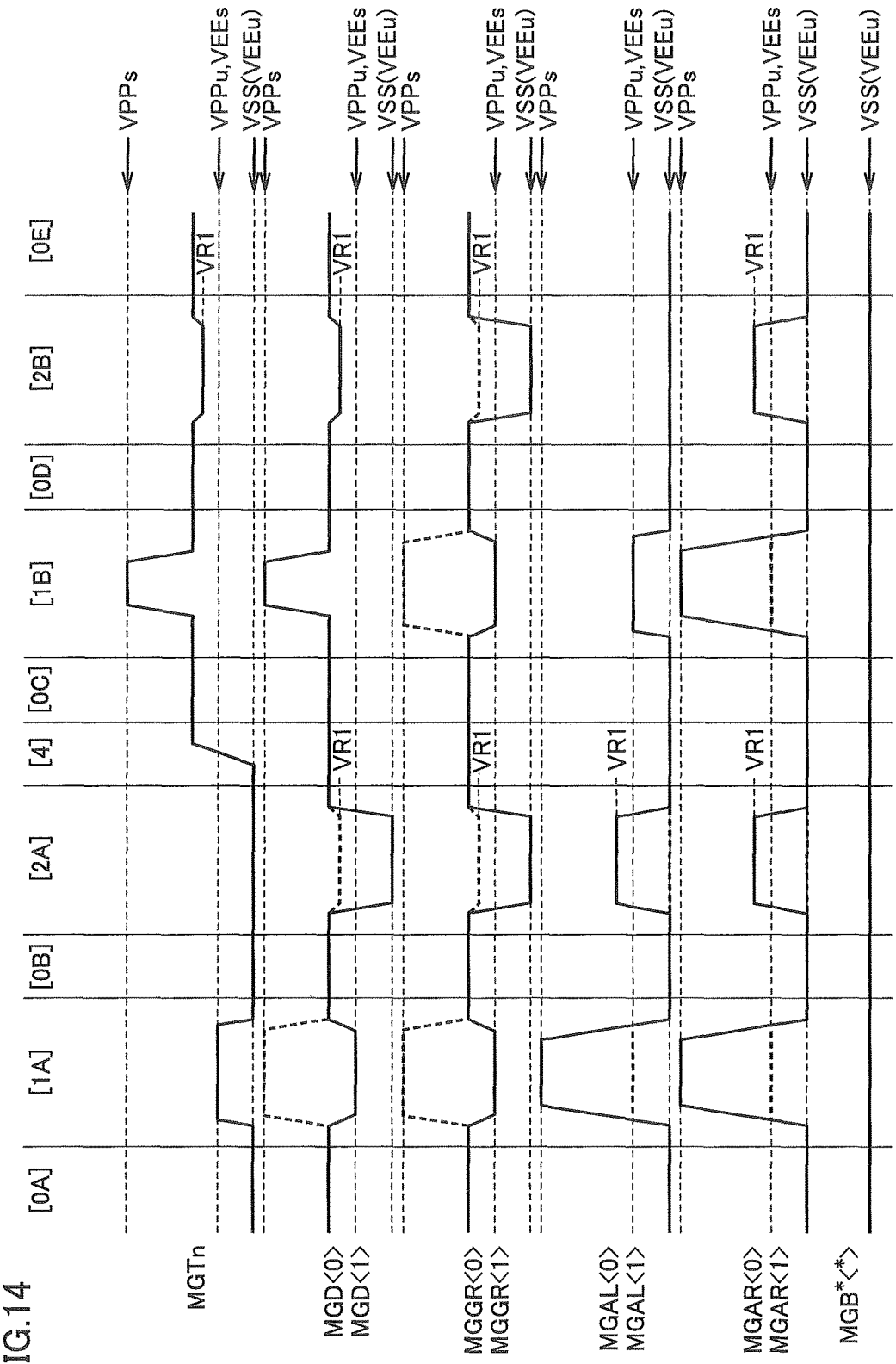
FIG. 14 illustrates transition of voltages of memory gate lines and gate voltage lines, and transition of control voltages in the fourth embodiment.

FIG. 14 illustrates transition of voltages of the memory gate lines and the gate voltage lines, and transition of the control voltages in the fourth embodiment.

FIG. 14 only illustrates voltages changed from, and added to, those in the second embodiment. Thus, positive-side voltages MGBPs, MGBPu and negative-side voltages MGBNs, MGBNu not illustrated make the same transitions as those in FIG. 9.

In FIG. 14, the voltages of switch signal MGTn, gate signal MGD<0>, gate voltage line MGGR<0>, and memory gate lines MGAL<0>, MGAR<0>, MGB*<*> are indicated by solid lines, while the voltages of gate signal MGD<1>, gate voltage line MGGR<1>, and memory gate lines MGAL<1>, MGAR<1> are indicated by broken lines.

The voltage transitions will now be described in accordance with the procedure of the flowchart of FIG. 8. A period of time corresponding to each step of the flowchart of FIG. 8 is indicated at the top of FIG. 14.

In step 0A (idle state), all signals are in a non-selected state, MGD<0>, MGD<1>, MGGR<0> and MGGR<1> are at the VR1 level, and the other signals are at the VSS (=VEEu) level.

In step 1A (application of the write pulse to left memory mat 1L), first decoder 5-1 causes, regarding control voltages MGBPs, MGBPu, MGBNs and MGBNu, positive-side select control voltage MGBPs to reach the VPPs level, positive-side non-select control voltage MGBPu to reach the VPPu level, negative-side select control voltage MGBNs to reach the VPPu level, and negative-side non-select control voltage MGBNu to maintain the VSS (=VEEu) level.

In addition, second decoder 5-2 causes, regarding gate voltage lines MGGR<0> and MGGR<1>, gate voltage line MGGR<0> of the selected row (0) to reach the VPPu (=VEEs) level, and the other to reach the VPPs level.

In addition, third decoder 5-33 causes switch signal MGTn to reach the VPPu (=VEEs) level. Consequently, PMOS transistors 52A<0>, 52A<1>, 52B<0> and 52B<1> included in MG switch circuit 62 are all turned on. As a result, memory gate lines MGAL<0> and MGAR<0> are connected together, memory gate lines MGAL<1> and MGAR<1> are connected together, memory gate lines MGBL<0> and MGBR<0> are connected together, and memory gate lines MGBL<1> and MGBR<1> are connected together.

In addition, third decoder 5-33 causes gate signal MGD<0> to reach the VPPu (=VEEs) level, and gate signal MGD<1> to reach the VPPs level. Consequently, NMOS transistors 81A<0> and 81B<0> are turned off, NMOS transistors 81A<1> and 81B<1> are turned on, memory gate lines MGAL<1> and MGAR<1> reach the negative-side select control voltage MGBNs (=VPPu) level, and memory gate lines MGBL<1> and MGBR<1> reach the negative-side non-select control voltage MGBNu (=VSS) level.

MG driver circuit 4R causes, regarding memory gate lines MGAL<0>, MGAL<1>, MGAR<0> and MGAR<1>, only memory gate lines MGAL<0> and MGAR<0> of the selected row (0) of selected block A of both memory mats (1L, 1R) to reach the VPPs level (to be activated).

Sense amplifier/write control circuit 6L causes a write pulse to be applied to left memory mat 1L based on write data WD that has been input to external data input/output terminal 15.

Then, the process returns to step 0B (idle state), before proceeding to step 2A. In step 2A (verify of left memory mat 1L), first decoder 5-1 causes, regarding control voltages MGBPs, MGBPu, MGBNs and MGBNu, only positive-side select control voltage MGBPs to reach the VR1 level, and the others to maintain the VSS (=VEEu) level.

In addition, second decoder 5-2 causes, regarding gate voltage lines MGGR<0> and MGGR<1>, gate voltage line MGGR<0> of the selected row (0) to reach the VSS (=VEEu) level, and the other to reach the VR1 level.

In addition, third decoder 5-33 causes switch signal MGTn to reach the VSS (=VEEu) level. Consequently, PMOS transistors 52A<0>, 52A<1>, 52B<0> and 52B<1> included in MG switch circuit 62 maintain the ON state. As a result, the connection between memory gate lines MGAL<0> and MGAR<0> is maintained, the connection between memory gate lines MGAL<1> and MGAR<1> is maintained, the connection between memory gate lines MGBL<0> and MGBR<0> is maintained, and the connection between memory gate lines MGBL<1> and MGBR<1> is maintained.

In addition, third decoder 5-33 causes gate signal MGD<0> to reach the VSS (=VEEu) level, and gate signal MGD<1> to reach the VR1 level. Consequently, NMOS transistors 81A<0> and 81B<0> are turned off, and NMOS transistors 81A<1> and 81B<1> are turned off.

MG driver circuit 4R causes, regarding memory gate lines MGAL<0>, MGAL<1>, MGAR<0> and MGAR<1>, only memory gate lines MGAL<0> and MGAR<0> of the selected row (0) of selected block A of both memory mats (1L, 1R) to reach the VR1 level, and the others to reach the VSS (=VEEu) level. In addition, MG driver circuit 4R causes memory gate lines MGBL<0>, MGBL<1>, MGBR<0> and MGBR<1> of non-selected block B to maintain VSS (=VEEu).

Sense amplifier/write control circuit 6L causes verify of left memory mat 1L to be performed.

Then, after step 4 (switching of the selected memory mat to right memory mat 1R) and step 0C (idle state) are performed, the process proceeds to step 1B.

In step 1B (application of the write pulse to right memory mat 1R), first decoder 5-1 causes, regarding control voltages MGBPs, MGBPu, MGBNs and MGBNu, positive-side select control voltage MGBPs to reach the VPPs level, positive-side non-select control voltage MGBPu to reach the VPPu level, negative-side select control voltage MGBNs to reach the VPPu level, and negative-side non-select control voltage MGBNu to maintain the VSS (=VEEu) level.

In addition, second decoder 5-2 causes, regarding gate voltage lines MGGR<0> and MGGR<1>, gate voltage line MGGR<0> of the selected row (0) to reach the VPPu (=VEEs) level, and the other to reach the VPPs level.

In addition, third decoder 5-33 causes switch signal MGTn to reach the VPPs level. Consequently, PMOS transistors 52A<0>, 52A<1>, 52B<0> and 52B<1> included in MG switch circuit 62 are all turned off. As a result, memory gate lines MGAL<0> and MGAR<0> are disconnected from each other, memory gate lines MGAL<1> and MGAR<1> are disconnected from each other, memory gate lines MGBL<0> and MGBR<0> are disconnected from each other, and memory gate lines MGBL<1> and MGBR<1> are disconnected from each other.

In addition, third decoder 5-33 causes gate signals MGD<0> and MGD<1> to reach the VPPs level. Consequently, NMOS transistors 81A<0>, 81B<0>, 81A<1> and 81B<1> are turned on, memory gate lines MGAL<0> and MGAL<1> are discharged and reach the negative-side select control voltage MGBNs (=VPPu) level, and memory gate lines MGBL<0> and MGBL<1> are discharged and reach the negative-side non-select control voltage MGBNu (=VSS) level.

MG driver circuit 4R causes, regarding memory gate lines MGAR<0>, MGAR<1>, MGBR<0> and MGBR<1>, memory gate line MGAR<0> of the selected row (0) of selected block A of right memory mat 1R to reach the VPPs level (to be activated), and MGAR<1> to reach the VPPu (=VEEs) level. MG driver circuit 4R causes memory gate lines MGBL<0>, MGBL<1>, MGBR<0> and MGBR<1> of non-selected block B to maintain VSS (=VEEu).

Sense amplifier/write control circuit 6R causes a write pulse to be applied to right memory mat 1R based on write data WD that has been input to external data input/output terminal 15.

Then, the process returns to step 0D (idle state), before proceeding to step 2B. In step 2B (verify of right memory mat 1R), first decoder 5-1 causes, regarding control voltages MGBPs, MGBPu, MGBNs and MGBNu, only positive-side select control voltage MGBPs to reach the VR1 level, and the others to maintain the VSS (=VEEu) level.

In addition, second decoder 5-2 causes, regarding gate voltage lines MGGR<0> and MGGR<1>, gate voltage line MGGR<0> of the selected row (0) to reach the VSS (=VEEu) level, and the other to reach the VR1 level.

In addition, third decoder 5-33 causes switch signal MGTn to reach the VR1 level. Consequently, PMOS transistors 52A<0>, 52A<1>, 52B<0> and 52B<1> included in MG switch circuit 62 maintain the OFF state. As a result, the disconnection between memory gate lines MGAL<0> and MGAR<0> is maintained, the disconnection between memory gate lines MGAL<1> and MGAR<1> is maintained, the disconnection between memory gate lines MGBL<0> and MGBR<0> is maintained, and the disconnection between memory gate lines MGBL<1> and MGBR<1> is maintained.

In addition, third decoder 5-33 causes gate signals MGD<0> and MGD<1> to reach the VR1 level. Consequently, NMOS transistors 81A<0> and 81B<0> are turned off, and NMOS transistors 81A<1> and 81B<1> are turned off.

MG driver circuit 4R causes, regarding memory gate lines MGAR<0>, MGAR<1>, MGBR<0> and MGBR<1>, memory gate line MGAR<0> of the selected row (0) of selected block A of right memory mat 1R to reach the VR1 level, and MGAR<1> to reach the VSS (=VEEu) level. MG driver circuit 4R causes memory gate lines MGBL<0>, MGBL<1>, MGBR<0> and MGBR<1> of non-selected block B to maintain VSS (=VEEu).

Sense amplifier/write control circuit 6R causes verify of right memory mat 1R to be performed.

As described above, according to the present embodiment, the memory gate line of the left mat and the memory gate line of the right memory mat are connected/disconnected by the NMOS transistors, thereby reducing the number of components and reducing the layout area as compared to the third embodiment using the CMOS transfer gate.

[Fifth Embodiment]

The overall configuration of a semiconductor device of the present embodiment is similar to the overall configuration of the semiconductor device of the second embodiment shown in FIG. 10. Thus, the description of the overall configuration will not be repeated.

Figure 15:
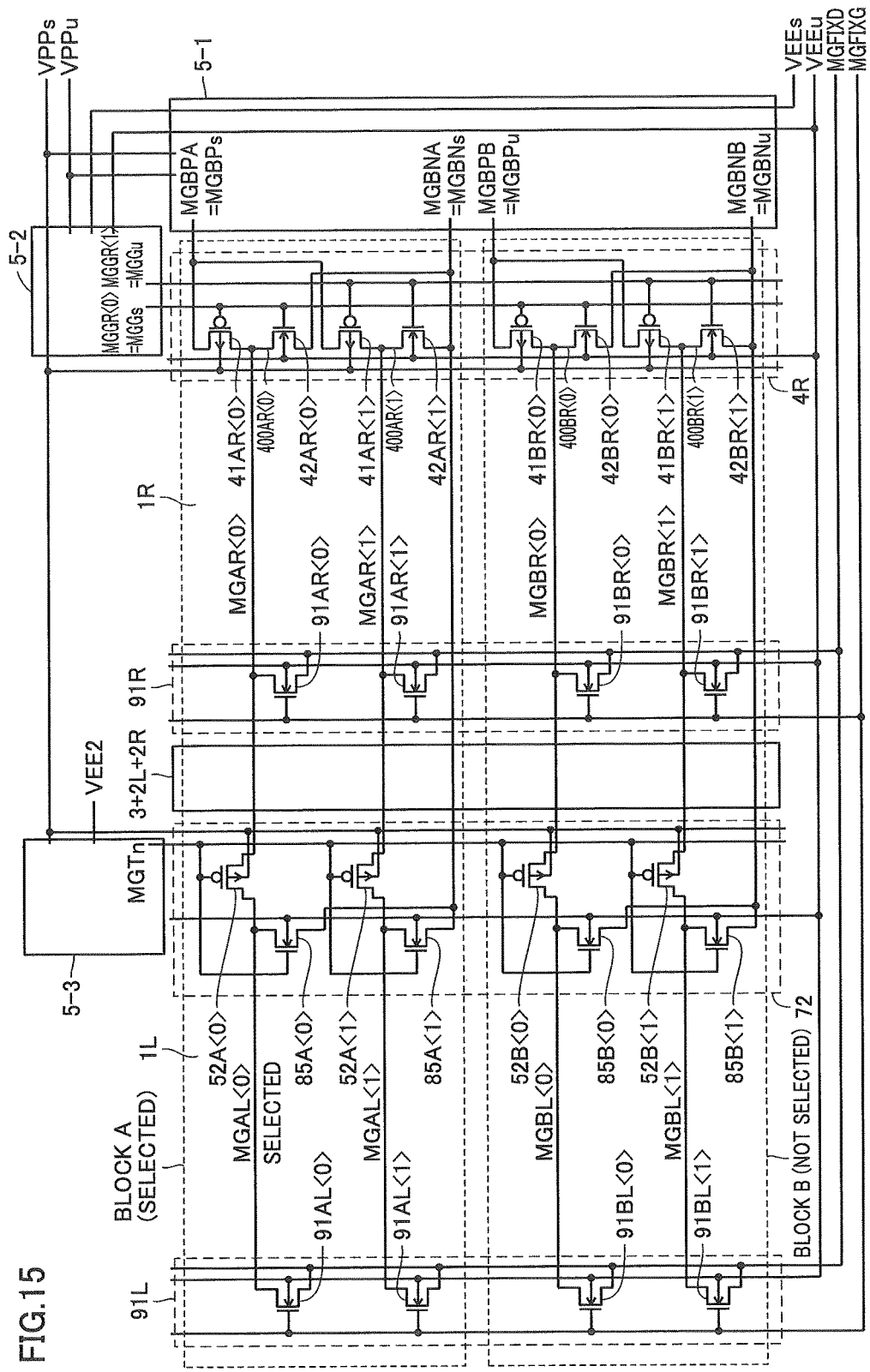
FIG. 15 shows a detailed configuration of a semiconductor device of a fifth embodiment.

FIG. 15 shows a detailed configuration of the semiconductor device of the fifth embodiment.

Memory cells 100L, 100R, control gate lines CGL, CGR, source line SL, and bit lines BLL, BLR are omitted in FIG. 15.

The semiconductor device of the fifth embodiment is different from the semiconductor device of the fourth embodiment of FIG. 13 on the following points.

The semiconductor device of the fifth embodiment includes, instead of third decoder 5-33, a third decoder 5-34 (switch control circuit). The semiconductor device of the fifth embodiment also includes, instead of MG switch and reset circuit 62, an MG switch and reset circuit 72.

MG switch and reset circuit 72 includes, as with MG switch circuit 62 of the fourth embodiment, PMOS transistors 52A<0> and 52A<1> included in block A, and PMOS transistors 52B<0> and 52B<1> included in block B.

Through PMOS transistors 52A<0>, 52A<1>, 52B<0> and 52B<1>, a rise of memory gate lines MGAL<0>, MGAL<1>, MGBL<0> and MGBL<1> of left mat 1L is effected. A fall of these memory gate lines is effected by NMOS transistors 85A<0>, 85A<1>, 85B<0> and 85B<1>. As such, the connection of the memory gate lines by the MG switch is only required during a rise of the memory gate lines of left mat 1L. Thus, the present embodiment does not include NMOS transistors 53A<0>, 53A<1>, 53B<0> and 53B<1> included in the third embodiment.

MG switch and reset circuit 72 includes, instead of NMOS transistors 81A<0>, 81A<1>, 81B<0> and 81B<1> included in MG switch circuit 62 of the fourth embodiment, NMOS transistors 85A<0>, 85A<1>, 85B<0> and 85B<1>.

NMOS transistor 85A<0> has a gate receiving switch signal MGTn. NMOS transistor 85A<0> has a drain connected to memory gate line MGAL<0>. NMOS transistor 85A<0> has a source connected to negative-side voltage line MGBNA.

NMOS transistor 85A<1> has a gate receiving switch signal MGTn. NMOS transistor 85A<1> has a drain connected to memory gate line MGAL<1>. NMOS transistor 85A<1> has a source connected to negative-side voltage line MGBNA.

NMOS transistor 85B<0> has a drain connected to memory gate line MGBL<0>. NMOS transistor 85B<0> has a source connected to negative-side voltage line MGBNB.

NMOS transistor 85B<1> has a gate receiving switch signal MGTn. NMOS transistor 85B<1> has a drain connected to memory gate line MGBL<1>. NMOS transistor 85B<1> has a source connected to negative-side voltage line MGBNB.

Although third decoder 5-33 supplies switch signal MGTn and gate signals MGD<0>, MGD<1> to MG switch and reset circuit 62 in the fourth embodiment, third decoder 5-34 of the fifth embodiment supplies only switch signal MGTn to MG switch and reset circuit 72. In order to turn PMOS transistors 52A<0>, 52A<1>, 52B<0> and 52B<1> on by switch signal MGTn, third decoder 5-34 generates switch signal MGTn using, as a negative power supply, a potential VEE2 lower than a minimum voltage VSS of the voltages output from MG drivers 40AR<0>, 40AR<1>, 40BR<0> and 40BR<1>.

Figure 16:
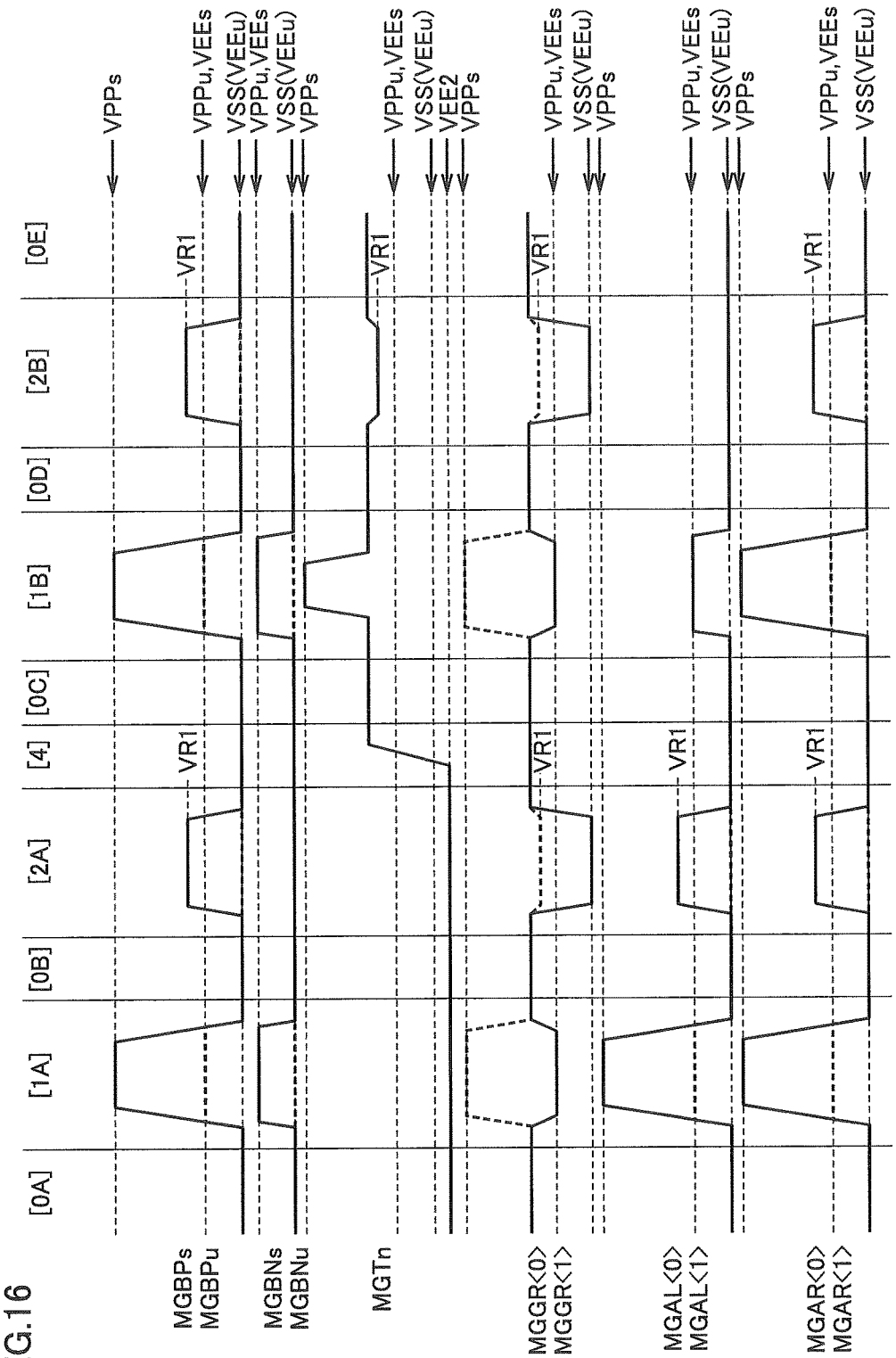
FIG. 16 illustrates transition of voltages of memory gate lines and gate voltage lines, and transition of control voltages in the fifth embodiment.

FIG. 16 illustrates transition of voltages of the memory gate lines and the gate voltage lines, and transition of the control voltages in the fifth embodiment.

FIG. 16 only illustrates voltages changed from, and added to, those in the second embodiment. In FIG. 16, positive-side select control voltage MGBPs, negative-side select control voltage MGBNs, and the voltages of switch signal MGTn, gate voltage line MGGR<0>, and memory gate lines MGAL<0>, MGAR<0> are indicated by solid lines, while positive-side non-select control voltage MGBPu, negative-side non-select control voltage MGBNu, and the voltages of gate voltage line MGGR<1> and memory gate lines MGAL<1>, MGAR<1> are indicated by broken lines.

The voltage transitions will now be described in accordance with the procedure of the flowchart of FIG. 8. A period of time corresponding to each step of the flowchart of FIG. 8 is indicated at the top of FIG. 16.

In step 0A (idle state), all signals are in a non-selected state, MGGR<0> and MGGR<1> are at the VR1 level, MGTn is at the VEE2 level, and the other signals are at the VSS (=VEEu) level.

In step 1A (application of the write pulse to left memory mat 1L), first decoder 5-1 causes, regarding control voltages MGBPs, MGBPu, MGBNs and MGBNu, positive-side select control voltage MGBPs to reach the VPPs level, positive-side non-select control voltage MGBPu to reach the VPPu level, negative-side select control voltage MGBNs to reach the VPPu level, and negative-side non-select control voltage MGBNu to maintain the VSS (=VEEu) level.

In addition, second decoder 5-2 causes, regarding gate voltage lines MGGR<0> and MGGR<1>, gate voltage line MGGR<0> of the selected row (0) to reach the VPPu (=VEEs) level, and the other to reach the VPPs level.

In addition, third decoder 5-34 causes switch signal MGTn to reach the VEE2 level. Consequently, PMOS transistors 52A<0>, 52A<1>, 52B<0> and 52B<1> included in MG switch circuit 72 are all turned on. As a result, memory gate lines MGAL<0> and MGAR<0> are connected together, memory gate lines MGAL<1> and MGAR<1> are connected together, memory gate lines MGBL<0> and MGBR<0> are connected together, and memory gate lines MGBL<1> and MGBR<1> are connected together. In addition, NMOS transistors 85A<0>, 85A<1>, 85B<0> and 85B<1> are turned off.

MG driver circuit 4R causes, regarding memory gate lines MGAL<0>, MGAL<1>, MGAR<0> and MGAR<1>, only memory gate lines MGAL<0> and MGAR<0> of the selected row (0) of selected block A of both memory mats (1L, 1R) to reach the VPPs level (to be activated). In addition, MG driver circuit 4R causes memory gate lines MGAL<1> and MGAR<1> of the non-selected row (1) of selected block A of both memory mats (1L, 1R) to reach the VPPu (=VEEs) level. In addition, MG driver circuit 4R causes memory gate lines MGBL<0>, MGBL<1>, MGBR<0> and MGBR<1> of non-selected block B to maintain VSS (=VEEu).

Sense amplifier/write control circuit 6L causes a write pulse to be applied to left memory mat 1L based on write data WD that has been input to external data input/output terminal 15.

Then, the process returns to step 0B (idle state), before proceeding to step 2A.

In step 2A (verify of left memory mat 1L), first decoder 5-1 causes, regarding control voltages MGBPs, MGBPu, MGBNs and MGBNu, only positive-side select control voltage MGBPs to reach the VR1 level, and the others to maintain the VSS (=VEEu) level.

In addition, second decoder 5-2 causes, regarding gate voltage lines MGGR<0> and MGGR<1>, gate voltage line MGGR<0> of the selected row (0) to reach the VSS (=VEEu) level, and the other to reach the VR1 level.

In addition, third decoder 5-34 causes switch signal MGTn to maintain the VEE2 level. Consequently, PMOS transistors 52A<0>, 52A<1>, 52B<0> and 52B<1> included in MG switch circuit 72 maintain the ON state. As a result, the connection between memory gate lines MGAL<0> and MGAR<0> is maintained, the connection between memory gate lines MGAL<1> and MGAR<1> is maintained, the connection between memory gate lines MGBL<0> and MGBR<0> is maintained, and the connection between memory gate lines MGBL<1> and MGBR<1> is maintained.

MG driver circuit 4R causes, regarding memory gate lines MGAL<0>, MGAL<1>, MGAR<0> and MGAR<1>, only memory gate lines MGAL<0> and MGAR<0> of the selected row (0) of selected block A of both memory mats (1L, 1R) to reach the VR1 level, and the others to reach the VSS (=VEEu) level. In addition, MG driver circuit 4R causes memory gate lines MGBL<0>, MGBL<1>, MGBR<0> and MGBR<1> of non-selected block B to maintain VSS (=VEEu).

Sense amplifier/write control circuit 6L causes verify of left memory mat 1L to be performed.

Then, after step 4 (switching of the selected memory mat to right memory mat 1R) and step 0C (idle state) are performed, the process proceeds to step 1B.

In step 1B (application of the write pulse to left memory mat 1L), first decoder 5-1 causes, regarding control voltages MGBPs, MGBPu, MGBNs and MGBNu, positive-side select control voltage MGBPs to reach the VPPs level, positive-side non-select control voltage MGBPu to reach the VPPu level, negative-side select control voltage MGBNs to reach the VPPu level, and negative-side non-select control voltage MGBNu to maintain the VSS (=VEEu) level.

In addition, second decoder 5-2 causes, regarding gate voltage lines MGGR<0> and MGGR<1>, gate voltage line MGGR<0> of the selected row (0) to reach the VPPu (=VEEs) level, and the other to reach the VPPs level.

In addition, third decoder 5-34 causes switch signal MGTn to reach the VPPs level. Consequently, PMOS transistors 52A<0>, 52A<1>, 52B<0> and 52B<1> included in MG switch circuit 72 are all turned off. As a result, memory gate lines MGAL<0> and MGAR<0> are disconnected from each other, memory gate lines MGAL<1> and MGAR<1> are disconnected from each other, memory gate lines MGBL<0> and MGBR<0> are disconnected from each other, and memory gate lines MGBL<1> and MGBR<1> are disconnected from each other. In addition, NMOS transistors 85A<0>, 85A<1>, 85B<0> and 85B<1> are turned on. As a result, memory gate lines MGAL<0> and MGAL<1> are discharged and reach the negative-side select control voltage MGBNs VPPu) level, and memory gate lines MGBL<0> and MGBL<1> are discharged and reach the negative-side non-select control voltage MGBNu (=VSS) level.

As such, MG driver circuit 4R causes, regarding memory gate lines MGAL<0>, MGAL<1>, MGAR<0> and MGAR<1>, only memory gate MGAR<0> of the selected row (0) of selected block A of right memory mat 1R to reach the VPPs level (to be activated), and the others to reach the VPPu (=VEEs) level. In addition, MG driver circuit 4R causes memory gate lines MGBL<0>, MGBL<1>, MGBR<0> and MGBR<1> of non-selected block B to maintain VSS (=VEEu).

Sense amplifier/write control circuit 6R causes a write pulse to be applied to right memory mat 1R based on write data WD that has been input to external data input/output terminal 15.

Then, the process returns to step 0D (idle state), before proceeding to step 2B.

In step 2B (verify of right memory mat 1R), first decoder 5-1 causes, regarding control voltages MGBPs, MGBPu, MGBNs and MGBNu, only positive-side select control voltage MGBPs to reach the VR1 level, and the others to maintain the VSS (=VEEu) level.

In addition, second decoder 5-2 causes, regarding gate voltage lines MGGR<0> and MGGR<1>, gate voltage line MGGR<0> of the selected row (0) to reach the VSS (=VEEu) level, and the other to reach the VR1 level.

In addition, third decoder 5-34 causes switch signal MGTn to reach the VR1 level. Consequently, PMOS transistors 52A<0>, 52A<1>, 52B<0> and 52B<1> included in MG switch circuit 72 maintain the OFF state. As a result, the disconnection between memory gate lines MGAL<0> and MGAR<0> is maintained, the disconnection between memory gate lines MGAL<1> and MGAR<1> is maintained, the disconnection between memory gate lines MGBL<0> and MGBR<0> is maintained, and the disconnection between memory gate lines MGBL<1> and MGBR<1> is maintained.

Further, consequently, NMOS transistors 85A<0>, 85A<1>, 85B<0> and 85B<1> maintain the ON state. Memory gate lines MGAL<0> and MGAL<1> reach the negative-side select control voltage MGBNs (=VSS) level, and memory gate lines MGBL<0> and MGBL<1> reach the negative-side non-select control voltage MGBNu (=VSS) level.

MG driver circuit 4R causes, regarding memory gate lines MGAR<0>, MGAR<1>, MGBR<0> and MGBR<1>, memory gate line MGAR<0> of the selected row (0) of selected block A of right memory mat 1R to reach the VR1 level, and MGAR<1> to reach the VSS level. MG driver circuit 4R causes memory gate lines MGBL<0>, MGBL<1>, MGBR<0> and MGBR<1> of non-selected block B to maintain VSS (=VEEu).

Sense amplifier/write control circuit 6R causes verify of right memory mat 1R to be performed.

As described above, according to the present embodiment, switch signal MGTn controls not only the PMOS transistors that connect or disconnect the memory gate line of the left memory mat and the memory gate line of the right mat, but also the NMOS transistors that reset the memory gate lines. Consequently, the present embodiment does not need switch signals MGD<0> and MGD<1> of the fourth embodiment to thereby reduce the number of signal lines, and does not need a circuit to generate switch signals MGD<0> and MGD<1>, either, to thereby reduce the layout area as compared to the fourth embodiment.

Similar functions can be implemented by causing third decoder 5-34 to generate switch signal MGTn using VSS as a negative power supply, as usual, and by applying a depression type to PMOS transistors 52A<0>, 52A<1>, 52B<0> and 52B<1>.

[Sixth Embodiment]

The overall configuration of a semiconductor device of the present embodiment is similar to the overall configuration of the semiconductor device of the second embodiment shown in FIG. 10. Thus, the description of the overall configuration will not be repeated.

Figure 17:
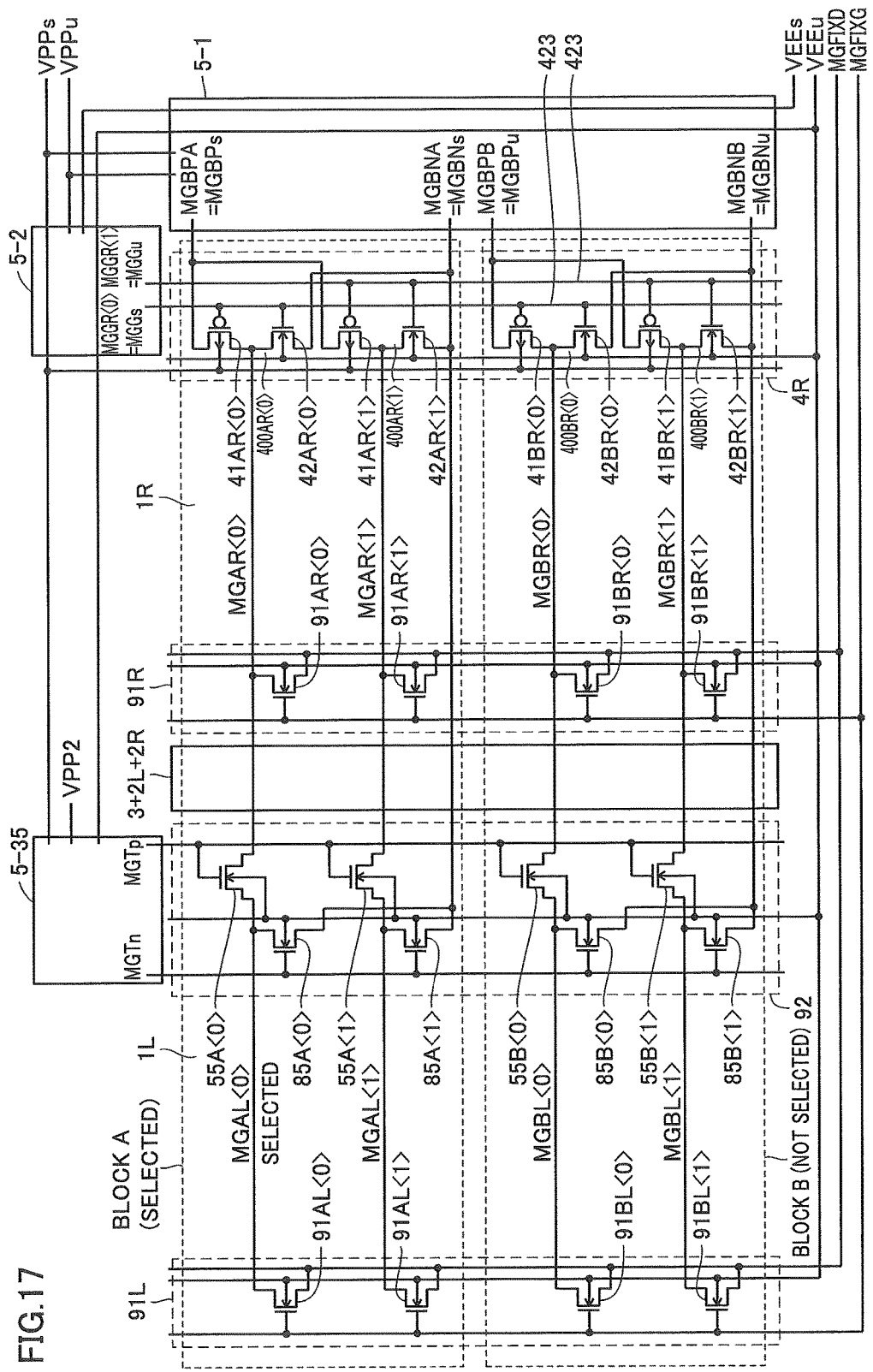
FIG. 17 shows a detailed configuration of a semiconductor device of a sixth embodiment.

FIG. 17 shows a detailed configuration of the semiconductor device of the sixth embodiment.

Memory cells 100L, 100R, control gate lines CGL, CGR, source line SL, and bit lines BLL, BLR are omitted in FIG. 17.

The semiconductor device of the present embodiment is different from the semiconductor device of the fifth embodiment of FIG. 15 on the following points.

The semiconductor device of the present embodiment includes, instead of third decoder 5-34, a third decoder 5-35 (switch control circuit). The semiconductor device of the present embodiment also includes, instead of MG switch and reset circuit 72, an MG switch and reset circuit 92.

MG switch and reset circuit 92 includes, as with MG switch circuit 62 of the fourth embodiment, NMOS transistors 85A<0> and 85A<1> included in block A, and NMOS transistors 85B<0> and 85B<1> included in block B.

MG switch and reset circuit 92 includes, instead of PMOS transistors 52A<0>, 52A<1>, 52B<0> and 52B<1> included in MG switch circuit 72 of the fifth embodiment, NMOS transistors 55A<0>, 55A<1>, 55B<0> and 55B<1>.

NMOS transistor 55A<0> is provided between one end of memory gate line MGAL<0> of left memory mat 1L and one end of memory gate line MGAR<0> of right memory mat 1R. NMOS transistor 55A<0> has a gate receiving switch signal MGTp.

NMOS transistor 55A<1> is provided between one end of memory gate line MGAL<1> of left memory mat 1L and one end of memory gate line MGAR<1> of right memory mat 1R. NMOS transistor 55A<1> has a gate receiving switch signal MGTp.

NMOS transistor 55B<0> is provided between one end of memory gate line MGBL<0> of left memory mat 1L and one end of memory gate line MGBR<0> of right memory mat 1R. NMOS transistor 55B<0> has a gate receiving switch signal MGTp.

NMOS transistor 55B<1> is provided between one end of memory gate line MGBL<1> of left memory mat 1L and one end of memory gate line MGBR<1> of right memory mat 1R. NMOS transistor 55B<1> has a gate receiving switch signal MGTp.

Third decoder 5-35 of the sixth embodiment supplies switch signals MGTn and MGTp to MG switch and reset circuit 92. In order to turn NMOS transistors 55A<0>, 55A<1>, 55B<0> and 55B<1> of MG switch and reset circuit 92 on, third decoder 5-35 generates switch signal MGTp using, as a positive power supply, a voltage VPP2 higher than maximum voltage VPPs of the voltages output from MG drivers 40AR<0>, 40AR<1>, 40BR<0> and 40BR<1>.

Further, it is only NMOS transistors 85A<0>, 85A<1>, 85B<0> and 85B<1>, without the PMOS transistors, that are controlled by switch signal MGTn. Thus, the lower limit of switch signal MGTn is at the VSS level. Accordingly, third decoder 5-35 generates switch signal MGTn using VSS, instead of VEE2, as a negative power supply.

Figure 18:
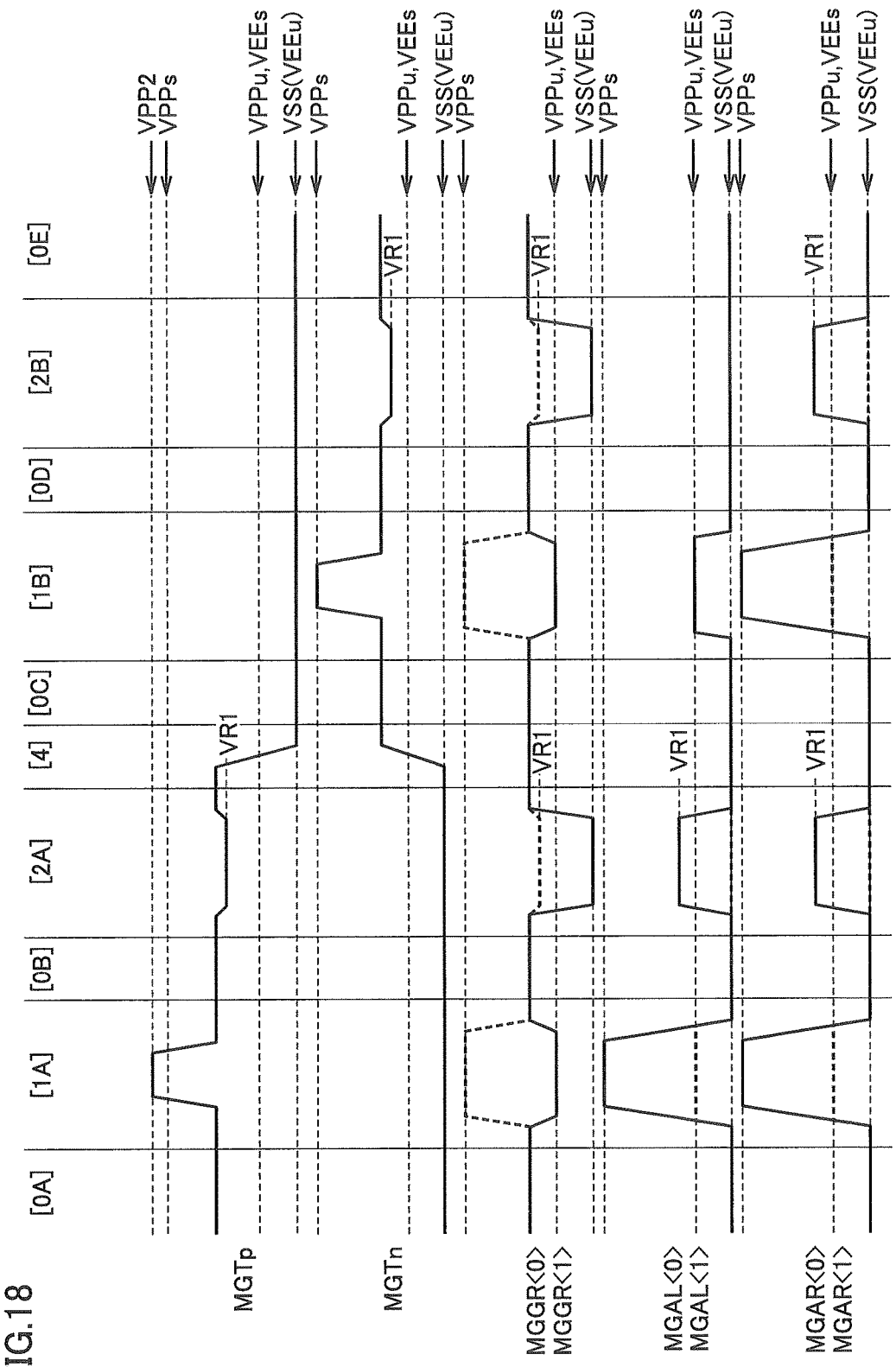
FIG. 18 illustrates transition of voltages of memory gate lines and gate voltage lines, and transition of control voltages in the sixth embodiment.

FIG. 18 illustrates transition of voltages of the memory gate lines and the gate voltage lines, and transition of the control voltages in the sixth embodiment.

FIG. 18 only illustrates voltages changed from, and added to, those in the second embodiment. In FIG. 18, the voltages of switch signals MGTp, MGTn, gate voltage line MGGR<0>, and memory gate lines MGAL<0>, MGAR<0> are indicated by solid lines, while the voltages of gate voltage line MGGR<1>, and memory gate lines MGAL<1>, MGAR<1> are indicated by broken lines.

The voltage transitions will now be described in accordance with the procedure of the flowchart of FIG. 8. A period of time corresponding to each step of the flowchart of FIG. 8 is indicated at the top of FIG. 18.

In step 0A (idle state), all signals are in a non-selected state, MGGR<0>, MGGR<1> and MGTp are at the VR1 level, MGTn is at the VEE2 level, and the other signals are at the VSS (=VEEu) level.

In step 1A (application of the write pulse to left memory mat 1L), first decoder 5-1 causes, regarding control voltages MGBPs, MGBPu, MGBNs and MGBNu, positive-side select control voltage MGBPs to reach the VPPs level, positive-side non-select control voltage MGBPu to reach the VPPu level, negative-side select control voltage MGBNs to reach the VPPu level, and negative-side non-select control voltage MGBNu to maintain the VSS (=VEEu) level.

In addition, second decoder 5-2 causes, regarding gate voltage lines MGGR<0> and MGGR<1>, gate voltage line MGGR<0> of the selected row (0) to reach the VPPu (=VEEs) level, and the other to reach the VPPs level.

In addition, third decoder 5-35 causes switch signal MGTp to reach the VPP2 level, and switch signal MGTn to reach the VSS level. Consequently, NMOS transistors 55A<0>, 55A<1>, 55B<0> and 55B<1> included in MG switch circuit 92 are all turned on. As a result, memory gate lines MGAL<0> and MGAR<0> are connected together, memory gate lines MGAL<1> and MGAR<1> are connected together, memory gate lines MGBL<0> and MGBR<0> are connected together, and memory gate lines MGBL<1> and MGBR<1> are connected together. In addition, NMOS transistors 85A<0>, 85A<1>, 85B<0> and 85B<1> are turned off.

MG driver circuit 4R causes, regarding memory gate lines MGAL<0>, MGAL<1>, MGAR<0> and MGAR<1>, only memory gate lines MGAL<0> and MGAR<0> of the selected row (0) of selected block A of both memory mats (1L, 1R) to reach the VPPs level (to be activated). In addition, MG driver circuit 4R causes memory gate lines MGAL<1> and MGAR<1> of the non-selected row (1) of selected block A of both memory mats (1L, 1R) to reach the VPPu (=VEEs) level. In addition, MG driver circuit 4R causes memory gate lines MGBL<0>, MGBL<1>, MGBR<0> and MGBR<1> of non-selected block B to maintain VSS (=VEEu).

Sense amplifier/write control circuit 6L causes a write pulse to be applied to left memory mat 1L based on write data WD that has been input to external data input/output terminal 15.

Then, the process returns to step 0B (idle state), before proceeding to step 2A.

In step 2A (verify of left memory mat 1L), first decoder 5-1 causes, regarding control voltages MGBPs, MGBPu, MGBNs and MGBNu, only positive-side select control voltage MGBPs to reach the VR1 level, and the others to maintain the VSS (=VEEu) level.

In addition, second decoder 5-2 causes, regarding gate voltage lines MGGR<0> and MGGR<1>, gate voltage line MGGR<0> of the selected row (0) to reach the VSS (=VEEu) level, and the other to reach the VR1 level.

In addition, third decoder 5-35 causes switch signal MGTp to reach the VR1 level. Consequently, NMOS transistors 55A<0>, 55A<1>, 55B<0> and 55B<1> included in MG switch circuit 92 maintain the ON state. As a result, the connection between memory gate lines MGAL<0> and MGAR<0> is maintained, the connection between memory gate lines MGAL<1> and MGAR<1> is maintained, the connection between memory gate lines MGBL<0> and MGBR<0> is maintained, and the connection between memory gate lines MGBL<1> and MGBR<1> is maintained.

In addition, third decoder 5-35 causes switch signal MGTn to maintain the VSS level. Consequently, NMOS transistors 85A<0>, 85A<1>, 85B<0> and 85B<1> maintain the OFF state.

MG driver circuit 4R causes, regarding memory gate lines MGAL<0>, MGAL<1>, MGAR<0> and MGAR<1>, only memory gate lines MGAL<0> and MGAR<0> of the selected row (0) of selected block A of both memory mats (1L, 1R) to reach the VR1 level, and the others to reach the VSS (=VEEu) level. In addition, MG driver circuit 4R causes memory gate lines MGBL<0>, MGBL<1>, MGBR<0> and MGBR<1> of non-selected block B to maintain VSS (=VEEu) level.

Sense amplifier/write control circuit 6L causes verify of left memory mat 1L to be performed.

Then, after step 4(switching of the selected memory mat to right memory mat 1R) and step 0C (idle state) are performed, the process proceeds to step 1B.

In step 1B (application of the write pulse to right memory mat 1R), first decoder 5-1 causes, regarding control voltages MGBPs, MGBPu, MGBNs and MGBNu, positive-side select control voltage MGBPs to reach the VPPs level, positive-side non-select control voltage MGBPu to reach the VPPu level, negative-side select control voltage MGBNs to reach the VPPu level, and negative-side non-select control voltage MGBNu to maintain the VSS (=VEEu) level.

In addition, second decoder 5-2 causes, regarding gate voltage lines MGGR<0> and MGGR<1>, gate voltage line MGGR<0> of the selected row (0) to reach the VPPu (=VEEs) level, and the other to reach the VPPs level.

In addition, third decoder 5-35 causes switch signal MGTp to reach the VSS level, and switch signal MGTn to reach the VPPs level. Consequently, NMOS transistors 55A<0>, 55A<1>, 55B<0> and 55B<1> included in MG switch circuit 92 are all turned off. As a result, memory gate lines MGAL<0> and MGAR<0> are disconnected from each other, memory gate lines MGAL<1> and MGAR<1> are disconnected from each other, memory gate lines MGBL<0> and MGBR<0> are disconnected from each other, and memory gate lines MGBL<1> and MGBR<1> are disconnected from each other. In addition, NMOS transistors 85A<0>, 85A<1>, 85B<0> and 85B<1> are turned on. As a result, memory gate lines MGAL<0> and MGAL<1> reach the negative-side select control voltage MGBNs VPPu) level, and the voltages of memory gate lines MGBL<0> and MGBL<1> are discharged and reach the negative-side non-select control voltage MGBNu (=VSS) level.

As such, MG driver circuit 4R causes, regarding memory gate lines MGAL<0>, MGAL<1>, MGAR<0> and MGAR<1>, only memory gate MGAR<0> of the selected row (0) of selected block A of right memory mat 1R to reach the VPPs level (to be activated), and the others to reach the VPPu (=VEEs) level. In addition, MG driver circuit 4R causes memory gate lines MGBL<0>, MGBL<1>, MGBR<0> and MGBR<1> of non-selected block B to maintain VSS (=VEEu).

Sense amplifier/write control circuit 6R causes a write pulse to be applied to right memory mat 1R based on write data WD that has been input to external data input/output terminal 15.

Then, the process returns to step 0D (idle state), before proceeding to step 2B.

In step 2B (verify of right memory mat 1R), first decoder 5-1 causes, regarding control voltages MGBPs, MGBPu, MGBNs and MGBNu, only positive-side select control voltage MGBPs to reach the VR1 level, and the others to maintain the VSS (=VEEu) level.

In addition, second decoder 5-2 causes, regarding gate voltage lines MGGR<0> and MGGR<1>, gate voltage line MGGR<0> of the selected row (0) to reach the VS S (=VEEu) level, and the other to reach the VR1 level.

In addition, third decoder 5-35 causes switch signal MGTn to reach the VR1 level. Consequently, NMOS transistors 85A<0>, 85A<1>, 85B<0> and 85B<1> maintain the ON state. Memory gate lines MGAL<0> and MGAL<1> reach the negative-side select control voltage MGBNs (=VSS) level, and memory gate lines MGBL<0> and MGBL<1> reach the negative-side non-select control voltage MGBNu (=VSS) level.

Third decoder 5-35 causes switch signal MGTp to maintain the VSS level.

MG driver circuit 4R causes, regarding memory gate lines MGAR<0>, MGAR<1>, MGBR<0> and MGBR<1>, memory gate line MGAR<0> of the selected row (0) of selected block A of right memory mat 1R to reach the VR1 level, and MGAR<1> to reach the VSS level. MG driver circuit 4R causes memory gate lines MGBL<0>, MGBL<1>, MGBR<0> and MGBR<1> of non-selected block B to maintain VSS (=VEEu).

Sense amplifier/write control circuit 6R causes verify of right memory mat 1R to be performed.

As described above, according to the present embodiment, the MG switch and reset circuit is formed of only the NMOS transistors, thus eliminating the need to separate the PMOS transistors and NMOS transistors, which would be required when the MG switch and reset circuit includes the PMOS transistors as in the fifth embodiment. As a result, the layout area can be reduced.

Similar functions can be implemented by causing third decoder 5-35 to generate switch signal MGTp using VPPs as a positive power supply, as usual, and by applying a depression type to NMOS transistors 55A<0>, 55A<1>, 55B<0> and 55B<1>.

[Seventh Embodiment]

Although the memory gate line is divided into two sections in the first to sixth embodiments, the effect of reducing a disturb can be improved by further dividing the memory gate line. In the present embodiment, the memory gate line of the semiconductor device of the fifth embodiment is modified such that it is divided into four sections.

Figure 19:
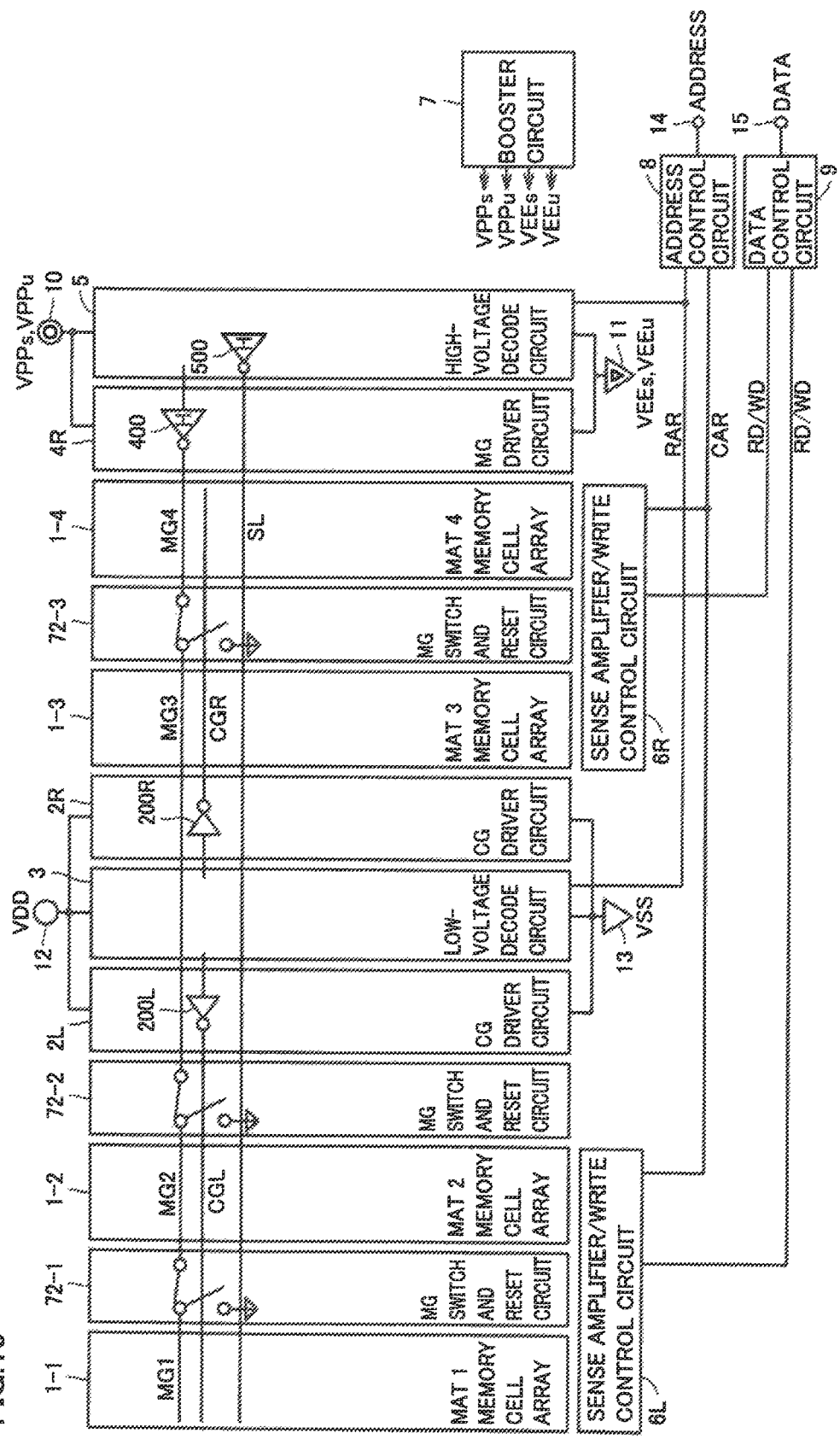
FIG. 19 illustrates a configuration of a semiconductor device of a seventh embodiment.

FIG. 19 illustrates a configuration of a semiconductor device of the seventh embodiment.

This semiconductor device is different from the semiconductor device of the fifth embodiment on the following points.

The memory cell array is divided into a mat 1 memory cell array 1-1 to a mat 4 memory cell array 1-4. Mat 1 memory cell array 1-1 is provided with memory gate line MG1, mat 2 memory cell array 1-2 is provided with memory gate line MG2, mat 3 memory cell array 1-3 is provided with memory gate line MG3, and mat 4 memory cell array 1-4 is provided with memory gate line MG4.

An MG switch and reset circuit 72-1 is disposed between mat 1 memory cell array 1-1 and mat 2 memory cell array 1-2. MG switch and reset circuit 72-1 connects/disconnects memory gate lines MG1 and MG2, and fixes the voltage of memory gate line MG1 while writing is not selected.

An MG switch and reset circuit 72-2 is disposed between mat 2 memory cell array 1-2 and mat 3 memory cell array 1-3. MG switch and reset circuit 72-2 connects/disconnects memory gate lines MG2 and MG3, and fixes the voltage of memory gate line MG2 while writing is not selected.

An MG switch and reset circuit 72-3 is disposed between mat 3 memory cell array 1-3 and mat 4 memory cell array 1-4. MG switch and reset circuit 72-3 connects/disconnects memory gate lines MG3 and MG4, and fixes the voltage of memory gate line MG3 while writing is not selected.

Figure 20:
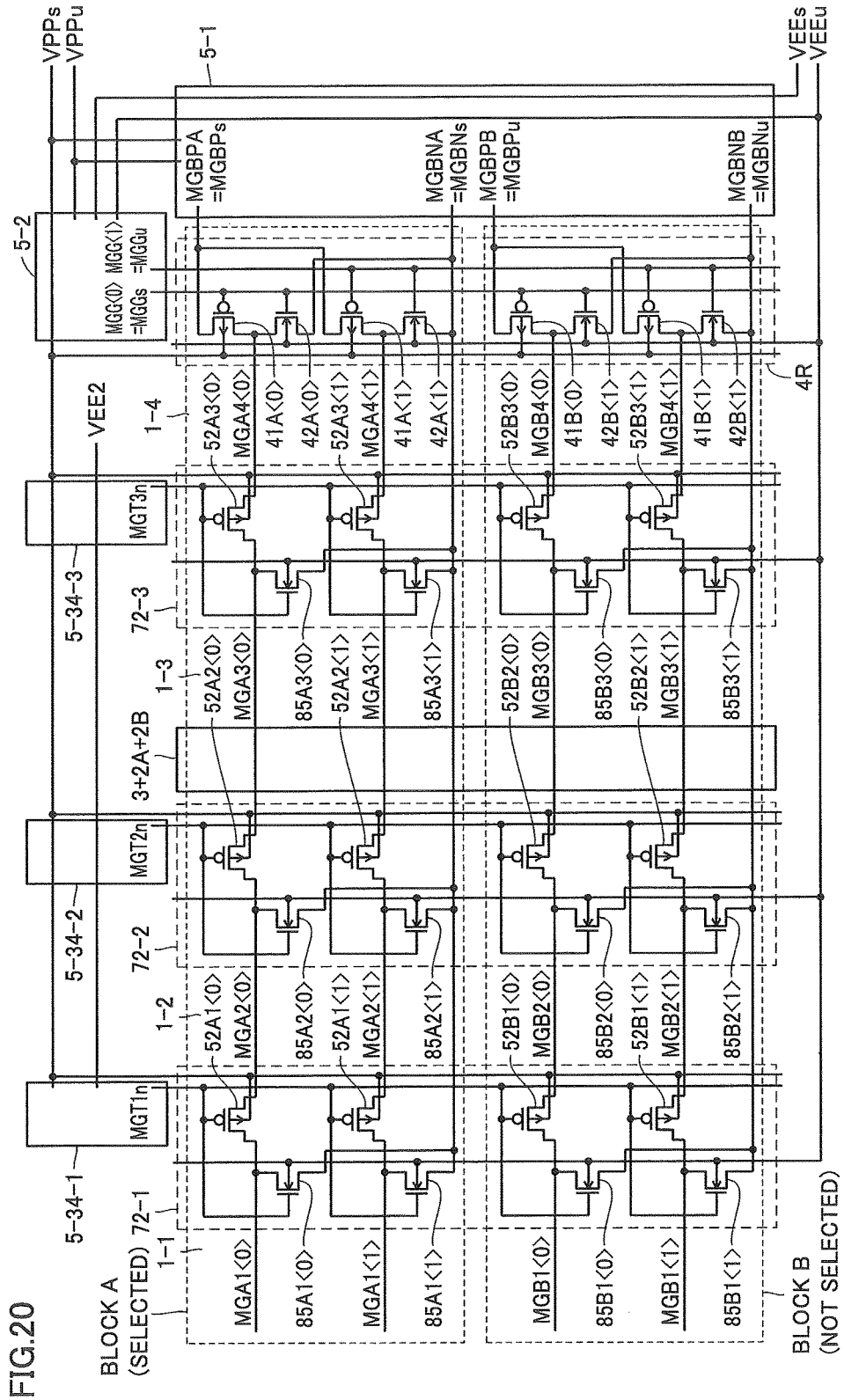
FIG. 20 shows a detailed configuration of the semiconductor device of the seventh embodiment.

FIG. 20 shows a detailed configuration of the semiconductor device of the seventh embodiment.

Memory cells 100L, 100R, control gate lines CGL, CGR, source line SL, and bit lines BLL, BLR are omitted in FIG. 20.

An MG switch and reset circuit 72-X includes PMOS transistors 52AX<0> and 52AX<1> included in block A, PMOS transistors 52BX<0> and 52BX<1> included in block B, and NMOS transistors 85AX<0>, 85AX<1>, 85BX<0> and 85BX<1>. Note that X indicates 1 to 3.

NMOS transistor 85AX<0> has a gate receiving a switch signal MGTXn. NMOS transistor 85AX<0> has a drain connected to memory gate line MGAX<0>. NMOS transistor 85AX<0> has a source connected to negative-side voltage line MGBNA.

NMOS transistor 85AX<1> has a gate receiving switch signal MGTXn. NMOS transistor 85AX<1> has a drain connected to memory gate line MGAX<1>. NMOS transistor 85AX<1> has a source connected to negative-side voltage line MGBNA.

NMOS transistor 85BX<0> has a gate receiving switch signal MGTXn. NMOS transistor 85BX<0> has a drain connected to memory gate line MGBX<0>. NMOS transistor 85BX<0> has a source connected to negative-side voltage line MGBNB.

NMOS transistor 85BX<1> has a gate receiving switch signal MGTXn. NMOS transistor 85BX<1> has a drain connected to memory gate line MGBX<1>. NMOS transistor 85BX<1> has a source connected to negative-side voltage line MGBNB.

PMOS transistor 52AX<0> is provided between one end of memory gate line MGAX<0> and one end of a memory gate line MGA(X+1)<0>. PMOS transistor 52AX<0> has a gate receiving switch signal MGTXn.

PMOS transistor 52AX<1> is provided between one end of memory gate line MGAX<1> and one end of a memory gate line MGA(X+1)<1>. PMOS transistor 52AX<1> has a gate receiving switch signal MGTXn.

PMOS transistor 52BX<0> is provided between one end of memory gate line MGBX<0> and one end of a memory gate line MGB(X+1)<0>. PMOS transistor 52BX<0> has a gate receiving switch signal MGTXn.

PMOS transistor 52BX<1> is provided between one end of memory gate line MGBX<1> and one end of a memory gate line MGB(X+1)<1>. PMOS transistor 52BX<1> has a gate receiving switch signal MGTXn.

A third decoder 5-34-X (switch control circuit) supplies switch signal MGTXn to MG switch and reset circuit 72-X. In order to turn PMOS transistors 52AX<0>, 52AX<1>, 52BX<0> and 52BX<1> on by switch signal MGTXn, third decoder 5-34-X generates switch signal MGTXn using potential VEE2 lower than VSS as a negative power supply. Note that X indicates 1 to 3.

Figure 21:
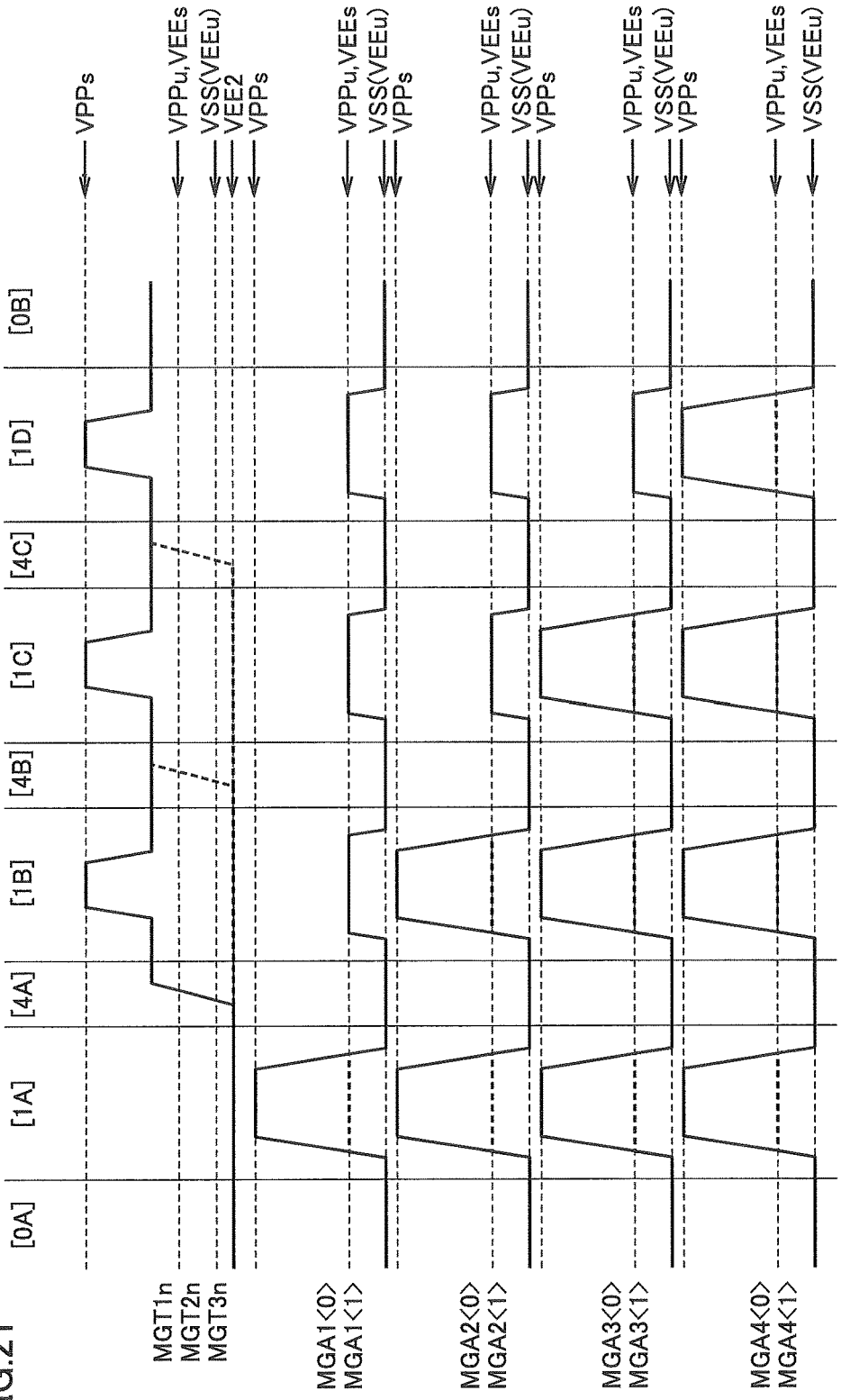
FIG. 21 illustrates transition of voltages of memory gate lines and gate voltage lines, and transition of control voltages in the seventh embodiment.

FIG. 21 illustrates transition of voltages of the memory gate lines and the gate voltage lines, and transition of the control voltages in the seventh embodiment.

A verify phase is omitted in FIG. 21, which only shows phases [1A], [1B], [1C], [1D] of write pulse application, phases [4A], [4B], [4C] of MG switch switching, and the first and last idle states [0A], [0B].

In FIG. 21, MGT1n, MGA1<0>, MGA2<0>, MGA3<0> and MGA4<0> are indicated by solid lines, MGT2n, MGA1<1>, MGA2<1>, MGA3<1> and MGA4<1> are indicated by broken lines, and MGT3n is indicated by a dotted line. The other signals (MGGR<0>, MGGR<1>, MGBPs, MGBPu, MGBNs and MGBNu) are similar to those illustrated in FIG. 16.

A period of time corresponding to each step of the flowchart of FIG. 8 is indicated at the top of FIG. 21.

In step 0A (idle state), MGT1n, MGT2n and MGT3n are all at the VEE2 level. Consequently, all of PMOS transistors 52AX<0>, 52AX<1>, 52BX<0> and 52BX<1> of MG switch and reset circuit 72-X (X=1 to 3) are ON, and all of NMOS transistors 85AX<0>, 85AX<1>, 85BX<0> and 85BX<1> are OFF.

Consequently, in step 1A (writing into mat 1), all of MGA1<0>, MGA2<0>, MGA3<0> and MGA4<0> reach the VPPs level.

In a step 4A (switching from mat 1 to mat 2), MGT1n switches from the VEE2 level to the VPPs level. Consequently, PMOS transistors 52A1<0>, 52A1<1>, 52B1<0> and 52B1<1> of MG switch and reset circuit 72-1 are turned off. In addition, NMOS transistors 85A1<0>, 85A1<1>, 85B1<0> and 85B1<1> are turned on, causing MGA1<0> to be disconnected from MG driver circuit 4R and fixed at voltage MGBNs of MGBNA.

Consequently, in step 2A (writing into mat 2), MGA2<0>, MGA3<0> and MGA4<0> except for MGA1<0> reach the VPPs level.

In a step 4B (switching from mat 2 to mat 3), MGT2n switches from the VEE2 level to the VPPs level. Consequently, PMOS transistors 52A2<0>, 52A2<1>, 52B2<0> and 52B2<1> of MG switch and reset circuit 72-2 are turned off. In addition, NMOS transistors 85A2<0>, 85A2<1>, 85B2<0> and 85B2<1> are turned on, causing MGA2<0> to be disconnected from MG driver circuit 4R and fixed at voltage MGBNs of MGBNA.

Consequently, in step 3A (writing into mat 3), MGA3<0> and MGA4<0> except for MGA1<0> and MGA2<0> reach the VPPs level.

In step 4B (switching from mat 3 to mat 4), MGT3n switches from the VEE2 level to the VPPs level. Consequently, PMOS transistors 52A3<0>, 52A3<1>, 52B3<0> and 52B3<1> of MG switch and reset circuit 72-3 are turned off. In addition, NMOS transistors 85A3<0>, 85A3<1>, 85B3<0> and 85B3<1> are turned on, causing MGA3<0> to be disconnected from MG driver circuit 4R and fixed at voltage MGBNs of MGBNA.

Consequently, in step 4A (writing into mat 4), MGA4<0> except for MGA1<0>, MGA2<0> and MGA3<0> reaches the VPPs level.

Then, the process returns to the idle state [0B].

As described above, according to the present embodiment, by dividing the memory cell array and the memory gate line into four sections, a period of time of a disturb applied to the memory gate line can be further reduced than the case where they are divided into two sections, thereby reducing the disturb stress applied to the memory gate line.

Moreover, in the present embodiment, instead of increasing the MG drivers by the number of divided memory gate lines as in the fifth embodiment, the plurality of memory gate lines are connected or disconnected by the MG switch circuit, thereby reducing the number of control circuits, lines and the like. As a result, the layout area can be reduced.

Although the present embodiment has been described with reference to an example where the memory cell array and the memory gate line are divided into four sections, the number of division can be arbitrarily increased with a similar method.

Next, the overall configuration of a semiconductor device of an embodiment of the present invention will be described.

(Microcomputer)

Figure 22:
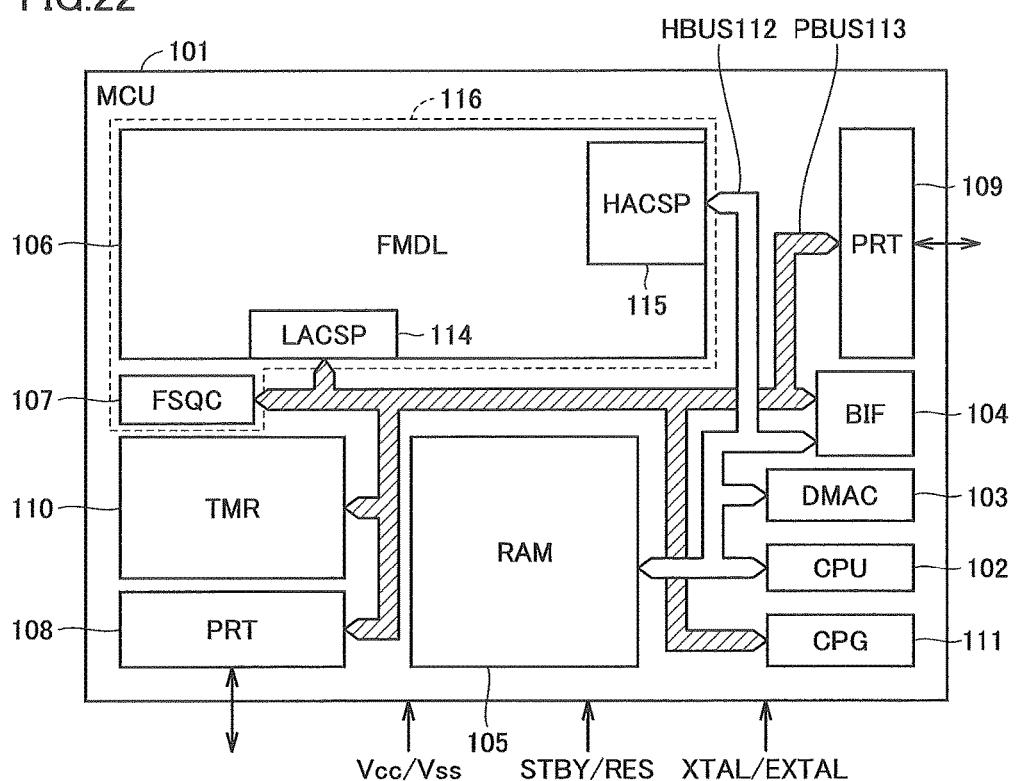
FIG. 22 is a block diagram showing a configuration of a semiconductor device according to an embodiment of the present invention.

FIG. 22 is a block diagram showing a configuration of a semiconductor device according to an embodiment of the present invention. FIG. 22 shows a configuration of a microcomputer (MAC) 101 as an example semiconductor device.

Referring to FIG. 22, microcomputer 101 is formed on a single semiconductor chip such as a single-crystal silicon, by using a CMOS (Complementary Metal Oxide Semiconductor) integrated circuit manufacturing technique, for example.

As shown in FIG. 22, microcomputer 101 includes a central processing unit (CPU) 102, a random access memory (RAM) 105, and a flash memory module (FMDL) 106. Central processing unit 102 includes an instruction control unit and an execution unit, and executes an instruction. Random access memory 105 is utilized as a work area and the like of central processing unit 102. Flash memory module 106 is provided as a nonvolatile memory module for storing data and programs.

Microcomputer 101 further includes a direct memory access controller (DMAC) 103, a bus interface circuit (BIF) 104, a flash sequencer (FSQC) 107, external input/output ports (PRTs) 108 and 109, a timer (TMR) 110, a clock pulse generator (CPG) 111, a high-speed bus (HBUS) 112, and a peripheral bus (PBUS) 113.

Bus interface circuit 104 performs bus interface control or bus bridge control of high-speed bus 112 and peripheral bus 113. Flash sequencer 107 performs command access control on flash memory module (FMDL) 106. Clock pulse generator 111 generates an internal clock CLK for controlling microcomputer 101.

Although the bus configuration of microcomputer 101 is not particularly limited, high-speed bus (HBUS) 112 and peripheral bus (PBUS) 113 are provided in the example of FIG. 22. Each of high-speed bus 112 and peripheral bus 113 has, although not particularly limited, a data bus, an address bus, and a control bus. By providing the two buses of high-speed bus 112 and peripheral bus 113, a load on the buses can be reduced as compared to an example where all circuits are commonly connected to a common bus, thereby ensuring high-speed access operation.

High-speed bus 112 is connected to central processing unit 102, direct memory access controller 103, bus interface circuit 104, random access memory 105, and flash memory module 106. Peripheral bus 113 is connected to flash sequencer 107, external input/output ports 108 and 109, timer 110, and clock pulse generator 111.

Microcomputer 101 further includes a clock teaninal XTAL/EXTAL connected to an oscillator or supplied with an external clock, an external hardware standby terminal STB indicating a standby state, an external reset teitninal RES indicating a reset, an external power supply terminal VCC, and an external grounding terminal Vss.

Although flash sequencer 107 serving as a logic circuit and flash memory module 106 having an array configuration are designed with different CAD tools and are thus illustrated as separate circuit blocks for convenience sake in FIG. 22, they together form a single flash memory 116.

Flash memory module 106 is connected to high-speed bus (HBUS) 112 through a read-only high-speed access port (HACSP) 115. CPU 102 or DMAC 103 can read-access flash memory module 106 from high-speed bus 112 through high-speed access port 115. When accessing flash memory module 106 for writing and initialization, CPU 102 or DMAC 103 issues a command to flash sequencer 107 through bus interface 104 via peripheral bus (PBUS) 113. In response to this command, flash sequencer 107 controls initialization and writing operation of the flash memory module from peripheral bus PBUS through a low-speed access port (LACSP).

The configuration described in the embodiment of the present invention corresponds to a memory mat portion in flash memory module 106.

Although the invention made by the present inventor has been specifically described above based on the embodiments, it goes without saying that the present invention is not limited to the embodiments, and can be modified in various ways within the scope not departing from the spirit of the invention.

REFERENCE SIGNS LIST 1L left mat memory cell array; 1R right mat memory cell array; 2L, 2R CG driver circuit; 3 low-voltage decode circuit; 4L, 4R MG driver circuit; 5 high-voltage decode circuit; 5-1 first decoder; 5-2 second decoder; 5-3, 5-32, 5-33, 5-34, 5-34-1, 5-34-2, 5-34-3, 5-34-4, 5-35 third decoder; 6L, 6R sense amplifier/write control circuit; 7 booster circuit; 8 address control circuit; 9 data control circuit; 10L, 10R positive power supply terminal; 11L, 11R negative power supply terminal; 12 positive voltage terminal; 13 negative voltage terminal; 14 external address input terminal; 15 external data input terminal; 52 MG switch circuit; 62, 72, 72-1, 72-2, 72-3, 72-4 MG switch and reset circuit; 81 MG reset circuit; 91L, 91R MG holding circuit; 100L, 100R memory cell; 101 microcomputer (semiconductor device); 102 CPU; 103 DMAC; 104 BIF; 105 RAM; 106 flash memory module; 107 flash sequencer; 108, 109 PRT; 110 TMR; 111 CPG; 112 HBUS; 113 PBUS; 114 LACSP; 115 HACSP; 116 FMDL; 200L, 200R CG driver; 500 SL driver; 400, 400L, 400R, 400AL<0>, 400AL<1>, 400BL<0>, 400BL<1>, 400AR<0>, 400AR<1>, 400BR<0>, 400BR<1> MG driver; 401, 41AL<0>, 41AL<1>, 41BL<0>, 41BL<1>, 41AR<0>, 41AR<1>, 41BR<0>, 41BR<1>, 52A<0>, 52A<1>, 52B<0>, 52B<1>, 52A1<0>, 52A1<1>, 52B1<0>, 52B1<1>, 52A2<0>, 52A2<1>, 52B2<0>, 52B2<1>, 52A3<0>, 52A3<1>, 52B3<0>, 52B3<1>, 52A4<0>, 52A4<1>, 52B4<0>, 52B4<1> PMOS transistor; 402, 42AL<0>, 42AL<1>, 42BL<0>, 42BL<1>, 42AR<0>, 42AR<1>, 42BR<0>, 42BR<1>, 53A<0>, 53A<1>, 53B<0>, 53B<1>, 55A<0>, 55A<1>, 55B<0>, 55B<1>, 81A<0>, 81A<1>, 81B<0>, 81B<1>, 85A<0>, 85A<1>, 85B<0>, 85B<1>, 85A1<0>, 85A1<1>, 85B1<0>, 85B1<1>, 85A2<0>, 85A2<1>, 85B2<0>, 85B2<1>, 85A3<0>, 85A3<1>, 85B3<0>, 85B3<1>, 85A4<0>, 85A4<1>, 85B4<0>, 85B4<1>, 91AL<0>, 91AL<1>, 91BL<0>, 91BL<1>, 91AR<0>, 91AR<1>, 91BR<0>, 91BR<1> NMOS transistor; MG memory gate; CG control gate; MG1, MG2, MG3, MG4, MGL, MGR, MGAL<0>, MGAL<1>, MGBL<0>, MGBL<1>, MGAR<0>, MGAR<1>, MGBR<0>, MGBR<1>, MGA1<0>, MGA1<1>, MGB1<0>, MGB1<1>, MGA2<0>, MGA2<1>, MGB2<0>, MGB2<1>, MGA3<0>, MGA3<1>, MGB3<0>, MGB3<1>, MGA4<0>, MGA4<1>, MGB4<0>, MGB4<1> memory gate line; MGBPA, MGBPB positive-side voltage line; MGBNA, MGBNB negative-side voltage line; MGGL<0>, MGGL<1>, MGGR<0>, MGGR<1> gate voltage line; CGL, CGR control gate line.

The invention claimed is:
1. A semiconductor device, comprising:
a first memory mat and a second memory mat each including a plurality of split gate type memory cells;
a first control gate line connected to a control gate of each of the split gate type memory cells in the first memory mat;
a second control gate line connected to a control gate of each of the split gate type memory cells in the second memory mat;
a first memory gate line connected to a memory gate of each of the split gate type memory cells in the first memory mat;
a second memory gate line connected to a memory gate of each of the split gate type memory cells in the second memory mat;
a first control gate (CG) driver configured to drive the first control gate line;
a second CG driver configured to drive the second control gate line;
at least one memory gate (MG) driver configured to drive the first memory gate line and the second memory gate line,
wherein the first CG driver and the second CG driver are disposed between the first memory mat and the second memory mat,
wherein the at least one MG driver is disposed outside a region surrounding both the first memory mat and the second memory mat,
wherein a single MG driver connected to the first memory gate line and configured to drive the first memory gate line and the second memory gate line is disposed outside the region at a Position adjacent to the first memory mat, and
wherein the semiconductor device comprises a switch circuit configured to connect and disconnect the first memory gate line to and from, respectively, the second memory gate line.

2. The semiconductor device according to claim 1, wherein a first MG driver configured to drive the first memory gate line is disposed outside the region at a position adjacent to the first memory mat, and
wherein a second MG driver configured to drive the second memory gate line is disposed outside the region at a position adjacent to the second memory mat.

3. The semiconductor device according to claim 2, further comprising a first decoder configured to supply a positive-side voltage to the first MG driver and the second MG driver through a positive-side voltage line, and to supply a negative-side voltage to the first MG driver and the second MG driver through a negative-side voltage line,
wherein the first decoder is disposed adjacent to the first MG driver.

4. The semiconductor device according to claim 1, further comprising a first decoder configured to supply a positive-side voltage to the single MG driver through a positive-side voltage line, and to supply a negative-side voltage to the single MG driver through a negative-side voltage line,
wherein the first decoder is disposed adjacent to the single MG driver.

5. The semiconductor device according to claim 4, further comprising:
a switch control circuit configured to control the switch circuit; and
a write control circuit configured to cause writing into the memory cells of the first memory mat and the second memory mat to be performed,
wherein, in a first step, the switch control circuit causes the switch circuit to be turned on, the MG driver activates the first memory gate line and the second memory gate line, and the write control circuit causes writing into the memory cells of the second memory mat to be performed, and
wherein, in a second step after the first step, the switch control circuit causes the switch circuit to be turned off, the MG driver activates the first memory gate line, and the write control circuit causes writing into the memory cells of the first memory mat to be performed.

6. The semiconductor device according to claim 5, further comprising a reset circuit for causing a potential of the second memory gate line to be discharged and fixed at a certain voltage while the switch circuit is off.

7. The semiconductor device according to claim 6, wherein the reset circuit includes a reset transistor connected between the second memory gate line and the negative-side voltage line.

8. The semiconductor device according to claim 7, wherein the switch circuit includes a PMOS transistor, and
wherein the reset transistor includes an NMOS transistor.

9. The semiconductor device according to claim 8, wherein the switch control circuit is configured to supply an identical gate control signal to a gate of the PMOS transistor and a gate of the NMOS transistor, and
wherein a negative-side voltage of the gate control signal is lower than a minimum voltage of voltages output from the MG driver.

10. The semiconductor device according to claim 8, wherein the switch control circuit is configured to supply an identical gate control signal to a gate of the PMOS transistor and a gate of the NMOS transistor,
wherein a negative-side voltage of the gate control signal is equal to a minimum voltage of voltages output from the MG driver, and
wherein the PMOS transistor is of a depression type.

11. The semiconductor device according to claim 7, wherein the switch circuit includes a first NMOS transistor, and
wherein the reset transistor includes a second NMOS transistor.

12. The semiconductor device according to claim 11, wherein the switch control circuit is configured to supply a first gate control signal to a gate of the first NMOS transistor, and to supply a second gate control signal to a gate of the second NMOS transistor, and
wherein a positive-side voltage of the first gate control signal is higher than a maximum voltage of voltages output from the MG driver.

13. The semiconductor device according to claim 11, wherein the switch control circuit is configured to supply a first gate control signal to a gate of the first NMOS transistor, and to supply a second gate control signal to a gate of the second NMOS transistor,
wherein a positive-side voltage of the first gate control signal is equal to a maximum voltage of voltages output from the MG driver, and
wherein the first NMOS transistor is of a depression type.

14. The semiconductor device according to claim 1, wherein the switch circuit includes a CMOS transfer gate.

15. The semiconductor device according to claim 1, further comprising:
a switch control circuit configured to control the switch circuit; and
a write control circuit configured to cause writing into the memory cells of the first memory mat and the second memory mat to be performed.

16. The semiconductor device according to claim 15, wherein the switch control circuit causes the switch circuit to be turned on, the MG driver activates the first memory gate line and the second memory gate line, and the write control circuit causes writing into the memory cells of the second memory mat to he performed.

17. The semiconductor device according to claim 16, wherein the switch control circuit further causes the switch circuit to be turned off, the MG driver activates the first memory gate line, and the write control circuit causes writing into the memory cells of the first memory mat to be performed.

18. The semiconductor device according to claim 15, wherein the switch control circuit causes the switch circuit to be turned off, the MG driver activates the first memory gate line, and the write control circuit causes writing into the memory cells of the first memory mat to be performed.

* * * * *